(12) United States Patent
Yang et al.

(10) Patent No.: US 11,783,903 B2
(45) Date of Patent: Oct. 10, 2023

(54) PROACTIVE EDGE WORD LINE LEAK DETECTION FOR MEMORY APPARATUS WITH ON-PITCH SEMI-CIRCLE DRAIN SIDE SELECT GATE TECHNOLOGY

(71) Applicant: SanDisk Technologies LLC, Addison, TX (US)

(72) Inventors: Xiang Yang, Santa Clara, CA (US); Xiaochen Zhu, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 71 days.

(21) Appl. No.: 17/511,966

(22) Filed: Oct. 27, 2021

(65) Prior Publication Data

US 2023/0125748 A1 Apr. 27, 2023

(51) Int. Cl.

| | |
|---|---|
| *G11C 16/34* | (2006.01) |
| *G11C 16/14* | (2006.01) |
| *G11C 16/04* | (2006.01) |
| *G11C 16/28* | (2006.01) |
| *G11C 16/08* | (2006.01) |
| *G11C 16/24* | (2006.01) |
| *G11C 16/10* | (2006.01) |

(52) U.S. Cl.
CPC ...... *G11C 16/3445* (2013.01); *G11C 16/0433* (2013.01); *G11C 16/08* (2013.01); *G11C 16/102* (2013.01); *G11C 16/14* (2013.01); *G11C 16/24* (2013.01); *G11C 16/28* (2013.01); *G11C 16/3404* (2013.01)

(58) Field of Classification Search
CPC ..... G11C 16/345; G11C 16/344; G11C 16/14; G11C 16/3445
See application file for complete search history.

(56) References Cited

U.S. PATENT DOCUMENTS

2022/0051738 A1\* 2/2022 Lee .................. G11C 29/44

\* cited by examiner

*Primary Examiner* — Kretelia Graham
(74) *Attorney, Agent, or Firm* — DICKINSON WRIGHT PLLC; Steven C. Hurles

(57) ABSTRACT

A memory apparatus and method of operation are provided. The apparatus includes memory cells connected to one of a plurality of word lines and arranged in strings and configured to retain a threshold voltage. A control means is coupled to the plurality of word lines and the strings. The control means is configured to apply a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location. The control means then determines the erase operation passed in response to the leak current measured not being greater than a predetermined leak threshold.

20 Claims, 20 Drawing Sheets

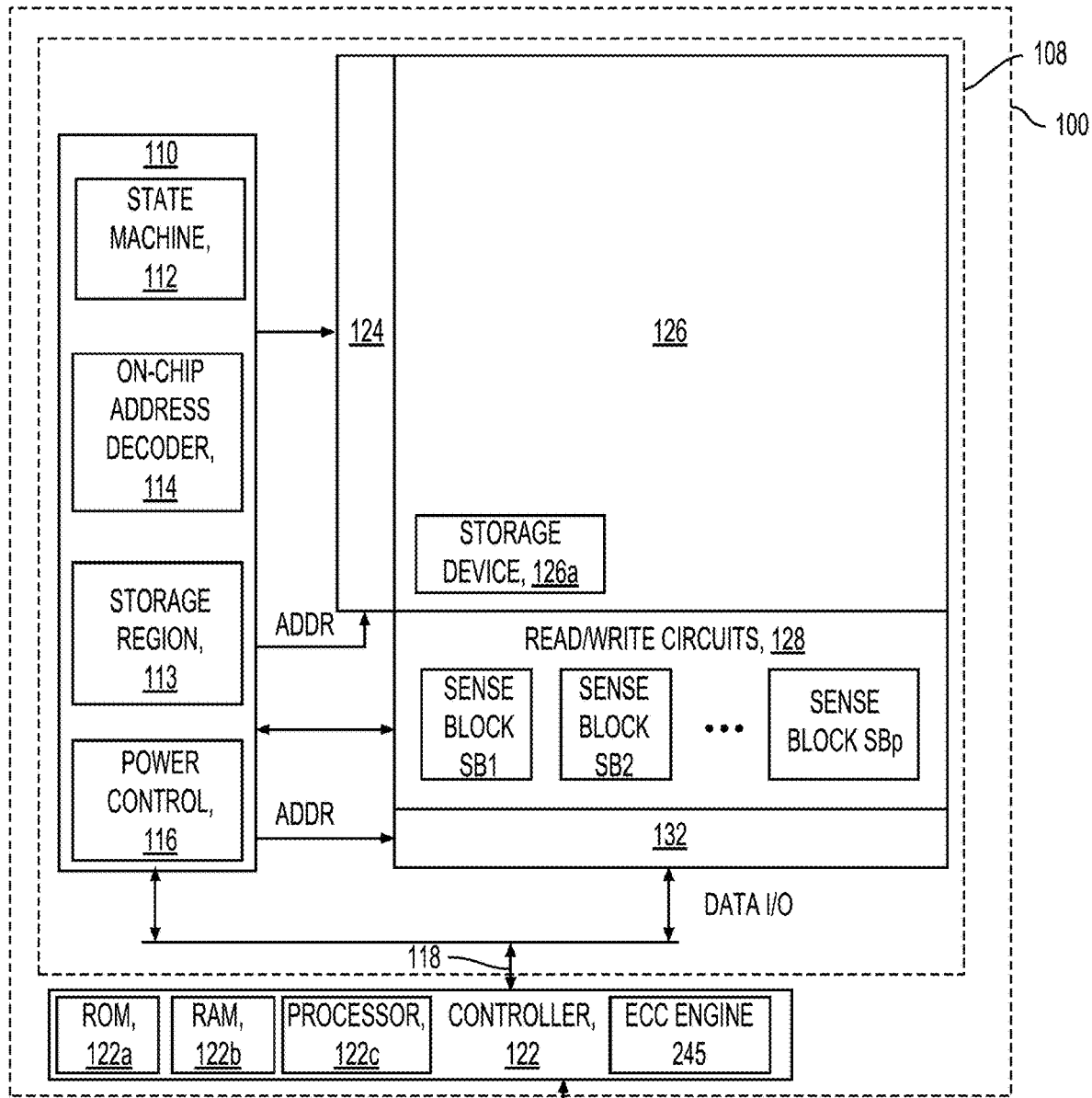
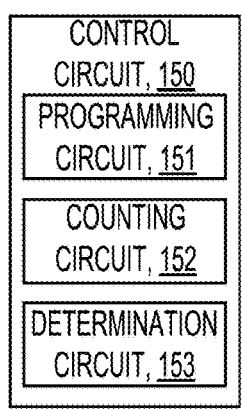
FIG. 1A
FIG. 1B

| | | | | |
|---|---|---|---|---|
| WLLEAK 7AA | 0 | 0 0.00 1D | | |
| DUT 1 WP | | 0.000 WP | -0.067a.u. rf=2 | |
| DUT 2 WP | | 0.000 WP | -0.067a.u. rf=2 | |
| DUT 3 WP | | 0.000 WP | -0.066a.u. rf=2 | |
| DUT 4 WP | | 0.000 WP | -54.775a.u. rf=0 | WL111 LEAK |
| WLLEAK 7AA | 0 | 1 0.00 1D | | |
| DUT 1 WP | | 0.000 WP | -0.067a.u. rf=2 | |
| DUT 2 WP | | 0.000 WP | -0.068a.u. rf=2 | |
| DUT 3 WP | | 0.000 WP | -0.068a.u. rf=2 | |
| DUT 4 WP | | 0.000 WP | -0.068a.u. rf=2 | WL110 NOT LEAK |
| WLLEAK 7AA | 0 | 2 0.00 1D | | |
| DUT 1 WP | | 0.000 WP | -0.067a.u. rf=2 | |
| DUT 2 WP | | 0.000 WP | -0.070a.u. rf=2 | |
| DUT 3 WP | | 0.000 WP | -0.068a.u. rf=2 | |
| DUT 4 WP | | 0.000 WP | -0.067a.u. rf=2 | WL109 NOT LEAK |
| WLLEAKDD0 7AA | 0 | 0 0.00 1D | | |
| DUT 1 WP | | 0.000 WP | -0.067a.u. rf=2 | |
| DUT 2 WP | | 0.000 WP | -0.068a.u. rf=2 | |
| DUT 3 WP | | 0.000 WP | -0.067a.u. rf=2 | |
| DUT 4 WP | | 0.000 WP | -0.067a.u. rf=2 | DD0 NOT LEAK |
| WLLEAKDD1 7AA | 0 | 0 0.00 1D | | |
| DUT 1 WP | | 0.000 WP | -0.068a.u. rf=2 | |
| DUT 2 WP | | 0.000 WP | -0.069a.u. rf=2 | |
| DUT 3 WP | | 0.000 WP | -0.070a.u. rf=2 | |
| DUT 4 WP | | 0.000 WP | -54.537a.u. rf=0 | DD1 LEAK |

FIG. 12

PROACTIVE EDGE WORD LINE LEAK DETECTION FOR MEMORY APPARATUS WITH ON-PITCH SEMI-CIRCLE DRAIN SIDE SELECT GATE TECHNOLOGY

FIELD

This application relates to non-volatile memory apparatuses and the operation of non-volatile memory apparatuses.

BACKGROUND

This section provides background information related to the technology associated with the present disclosure and, as such, is not necessarily prior art.

Semi-circle drain side select gate ("SC-SGD") memory technology offers several advantages, including reduced die size. In order to produce SC-SGD, etching technology is used to cut memory holes, thus giving them their semi-circular shape, and separating a block or row into several strings. Depending upon the process used to form the SC-SGD, certain inefficiencies can occur. For example, cutting a memory hole will remove at least some portions of the SC-SGD, such as the metal layer that otherwise shields electrical fields from the channel and/or charge trap layer. Thus, the SC-SGD can be influenced by a "neighboring" electric field, causing a parasitic transistor to leak along the SC-SGD transistor. In some cases, this causes a sensing amplifier to incorrectly determine the SC-SGD is conducting, which can affect certain sensing operations. Also, due to etching variation, some dies may be cut down to an SGD layer, while others may be cut down to layers forming dummy word lines. Consequently, electrical fields, such as those introduced by weak erase bias on the dummy word lines from word line cycling, are known to distort (e.g., shift down) the threshold voltage of SC-SGD, and thus alter the overall threshold voltage of a memory structure. Short circuits may also exist, for example, between one of the dummy word lines and another word line. Accordingly, there is a need for improved non-volatile memory apparatuses and methods of operation.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells connected to one of a plurality of word lines and arranged in strings and configured to retain a threshold voltage. A control means is coupled to the plurality of word lines and the strings. The control means is configured to apply a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location. The control means then determines the erase operation passed in response to the leak current measured not being greater than a predetermined leak threshold.

According to another aspect of the disclosure, a controller in communication with a memory apparatus including memory cells connected to one of a plurality of word lines and arranged in strings and configured to retain a threshold voltage is also provided. The controller is configured to instruct the memory apparatus to apply a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location. The controller is also configured to determine the erase operation passed in response to the leak current measured not being greater than a predetermined leak threshold.

According to an additional aspect of the disclosure a method of operating a memory apparatus is provided. The memory apparatus includes memory cells connected to one of a plurality of word lines and arranged in strings and configured to retain a threshold voltage. The method includes the step of applying a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location. The next step of the method is determining the erase operation passed in response to the leak current measured not being greater than a predetermined leak threshold.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1A is a block diagram of an example memory device according to aspects of the disclosure;

FIG. 1B is a block diagram of an example control circuit that includes a programming circuit, a counting circuit, and a determination circuit according to aspects of the disclosure;

FIG. 12 illustrates that there is leak current for one of the data word lines and a dummy word line, but not for other data or dummy word lines according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2:
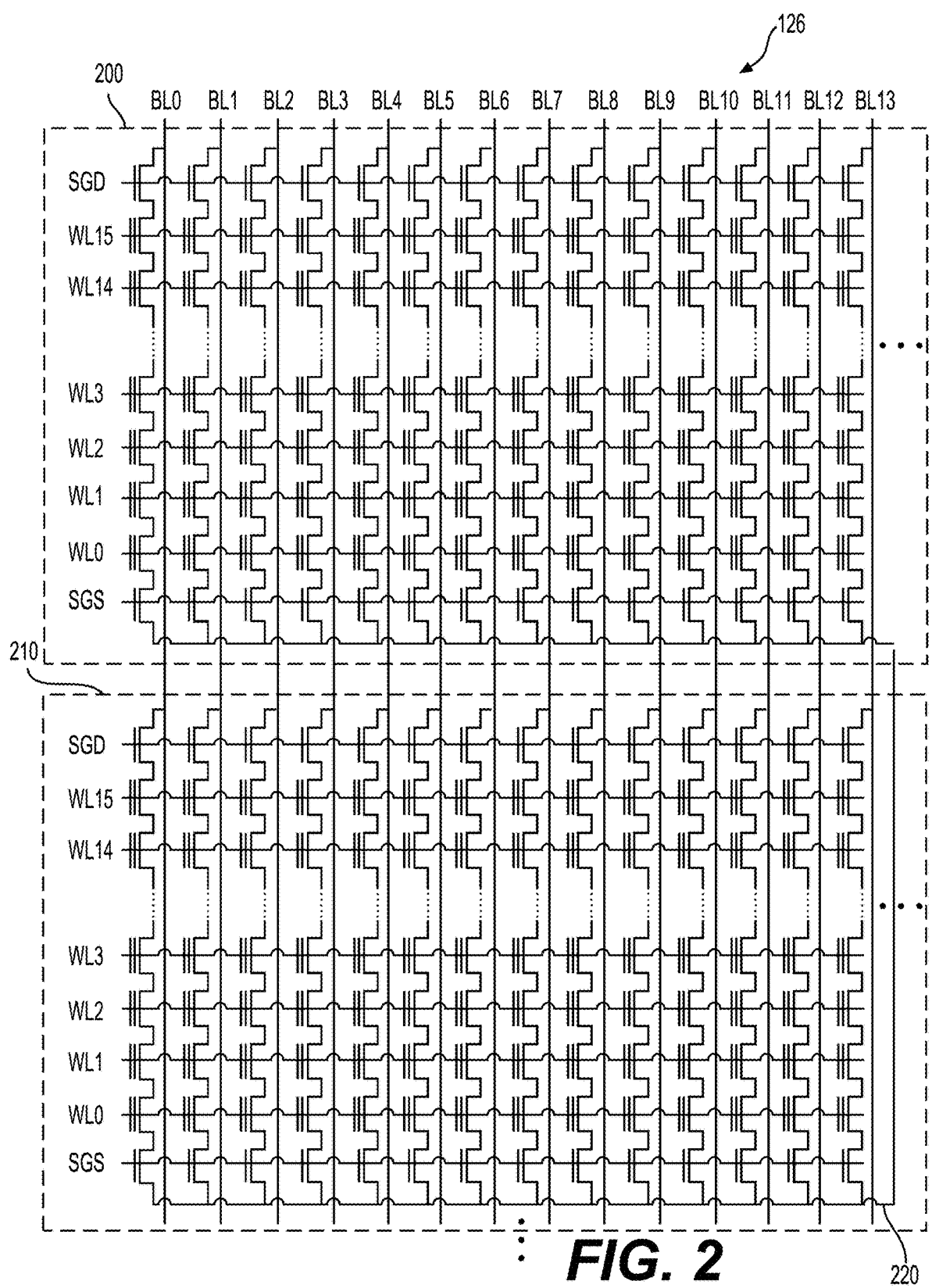
FIG. 2 illustrates schematic views of three types of memory architectures utilizing staggered memory strings according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

Each memory cell may be associated with a data state according to write data in a program command. Based on its data state, a memory cell will either remain in the erased state or be programmed to a programmed data state. For example, in a three bit per cell memory device, there are eight data states including the erased state and the programmed state.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be inhibited from further programming while programming continues for other memory cells in subsequent program loops.

When creating various rows and strings for a memory structure, a cutting operation (e.g., shallow hole etch, or SHE) can be used. The SHE cut can divide a block (in memory) into multiple strings within the block. While the SHE can form/define the strings, the SHE cut can further separate a string, i.e., cut the edge memory holes in a string into half (or approximately two equal halves). In this regard, both the SGD and the channel are split. Nevertheless, since the cells are cut, the poly-channel is exposed to a neighbor SGD electrical field. The channel area close to neighbor SGD can be easily turned on during memory operations (i.e., NAND operation), which can be result in "SGD downshift". When the SHE cut is closer to a data word line adjacent dummy word lines (i.e., an edge word line), over cycling some "outlier" blocks are found to not be robust anymore, even if the edge word line is not physically cut. At some point, the edge word line can be shorted to one of the dummy word lines during an erase operation due to SHE cut induced MANOS damage. This causes subsequent program failure. Unfortunately, the block can still pass the erase operation (erase status "pass"). Therefore, it may not be possible to avoid data corruption or detect bad blocks immediately using erase status.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, ... which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
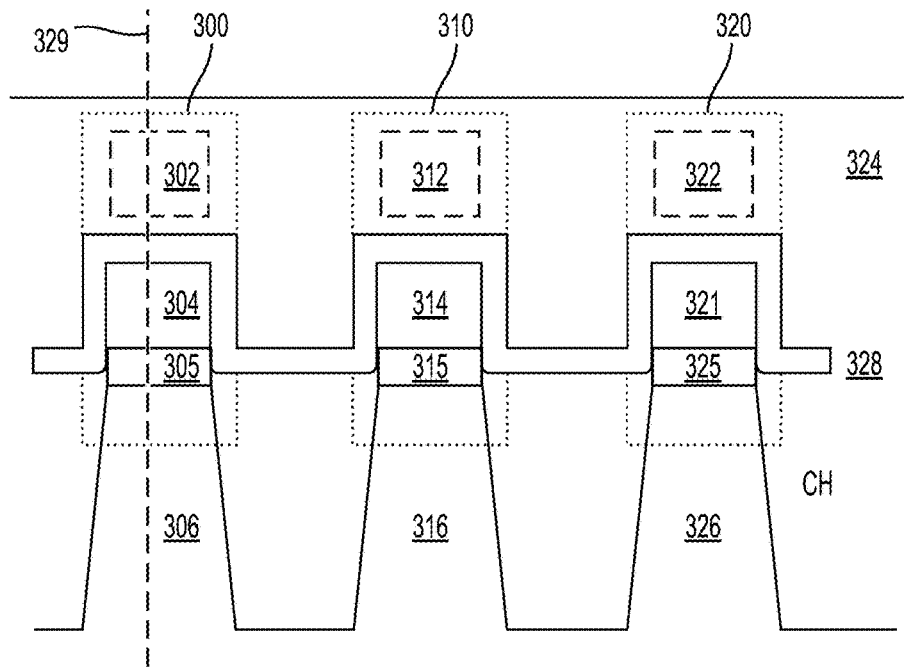
FIG. 3A illustrates a cross-sectional view of example floating gate memory cells in NAND strings according to aspects of the disclosure.
Figure 3B:
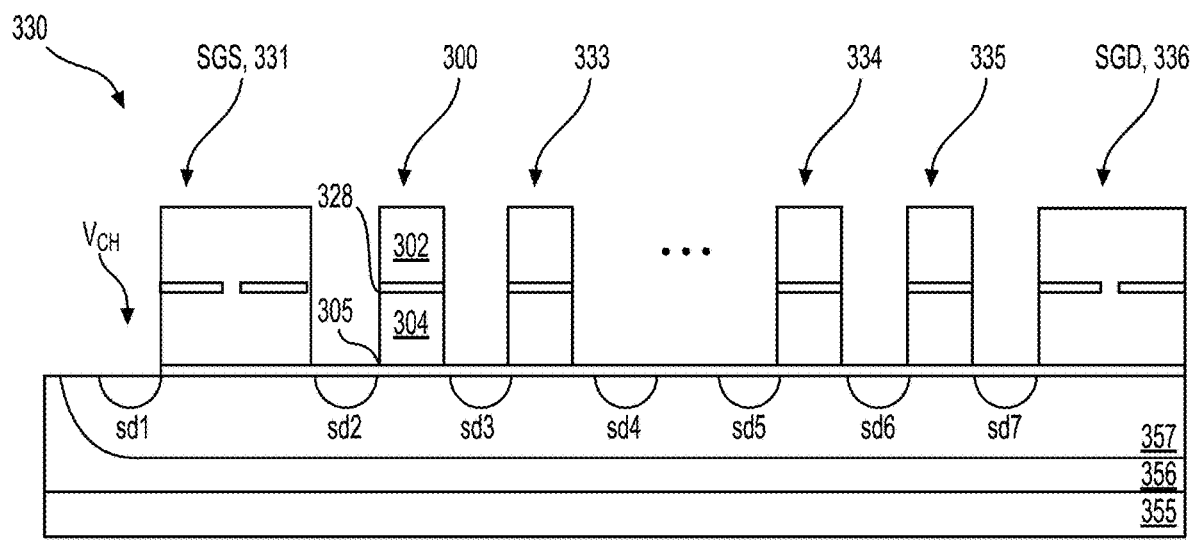
FIG. 3B illustrates a cross-sectional view along a contact line shown in FIG. 3A according to aspects of the disclosure.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
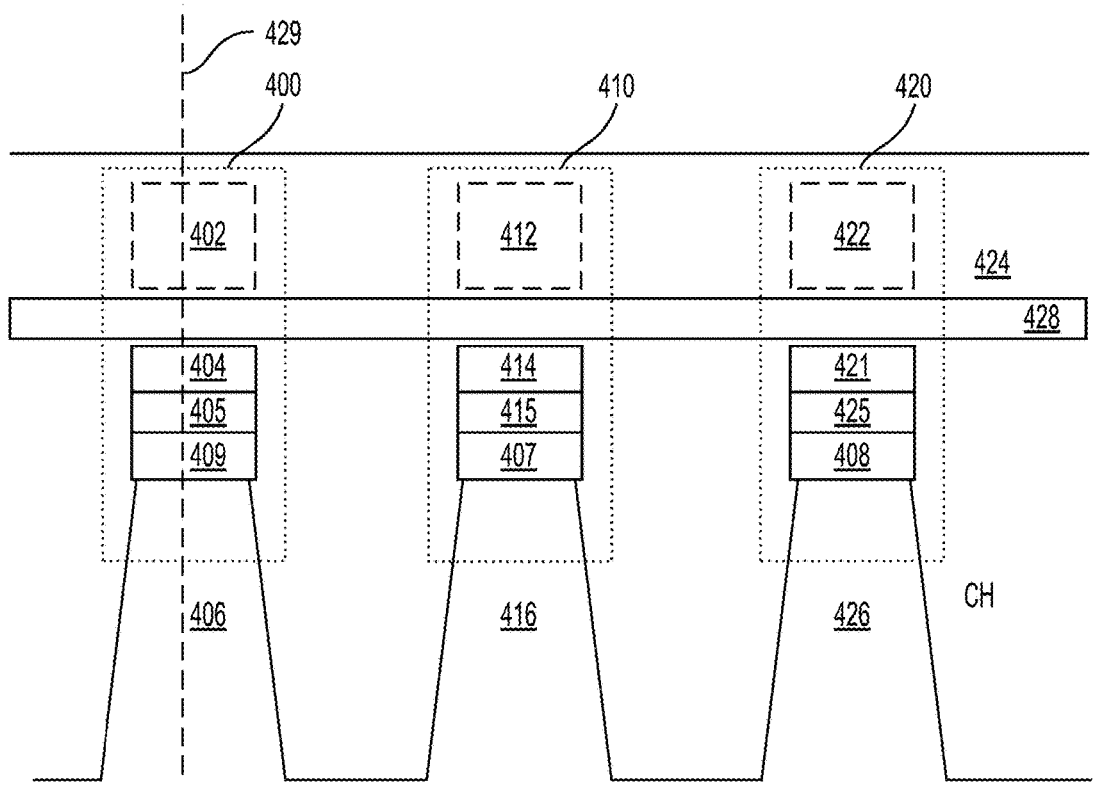
FIGS. 4A and 4B illustrate non-volatile memory in which a charge-trapping memory cell uses a non-conductive dielectric material in place of a conductive floating gate to store charge in a non-volatile manner according to aspects of the disclosure.
Figure 4B:
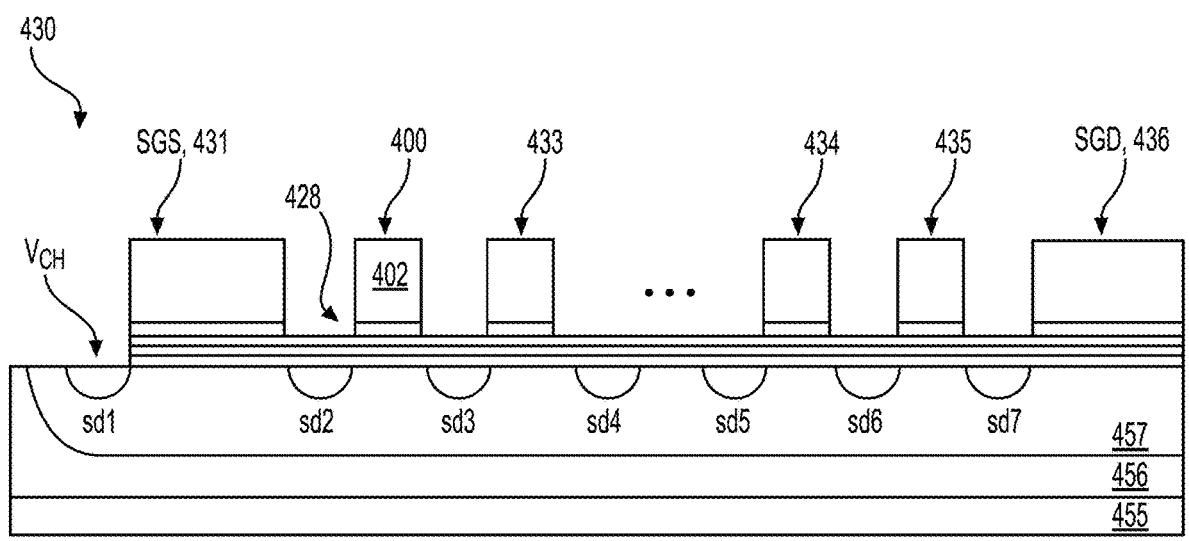

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
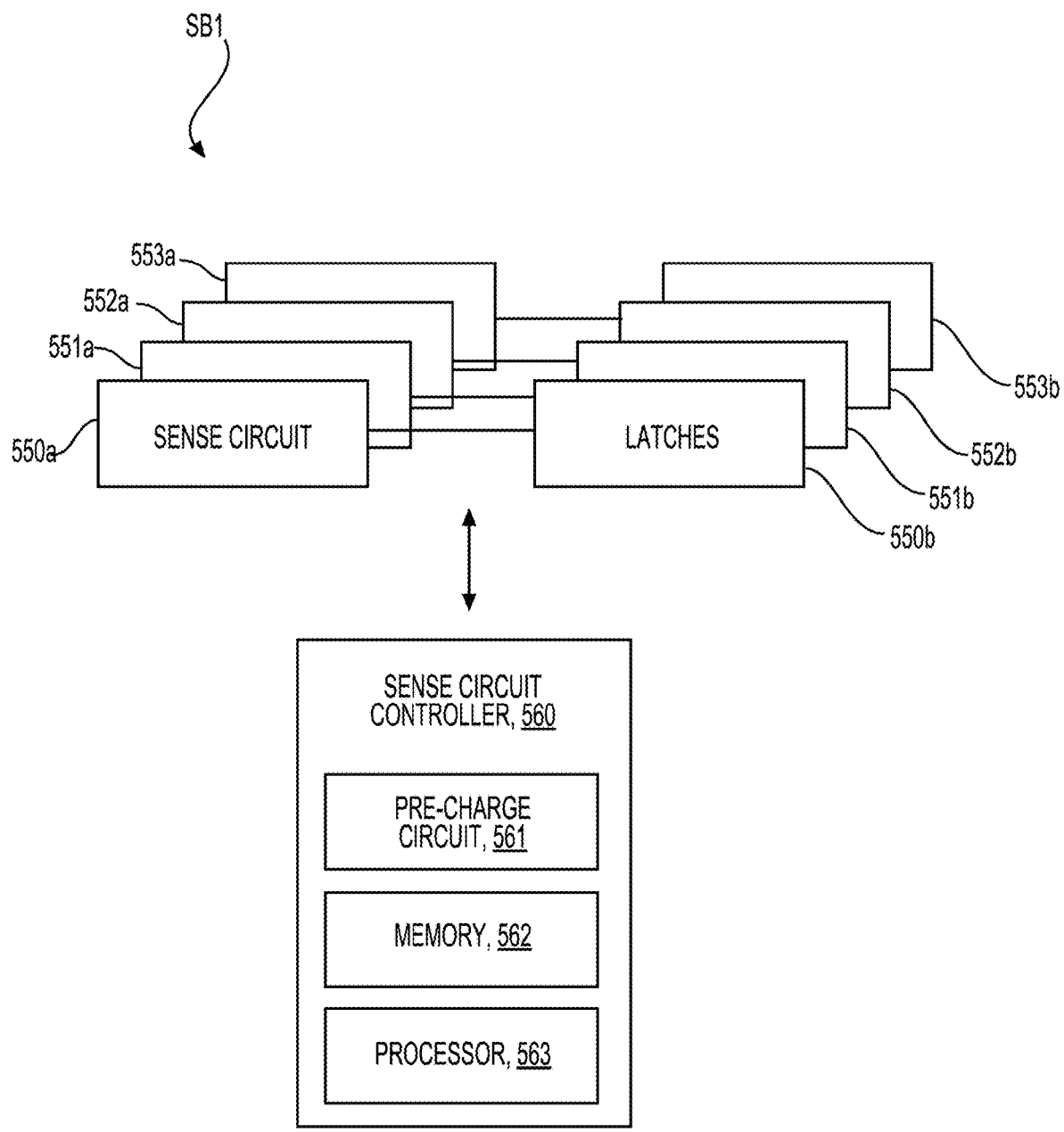
FIG. 5 illustrates an example block diagram of the sense block of FIG. 1 according to aspects of the disclosure.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
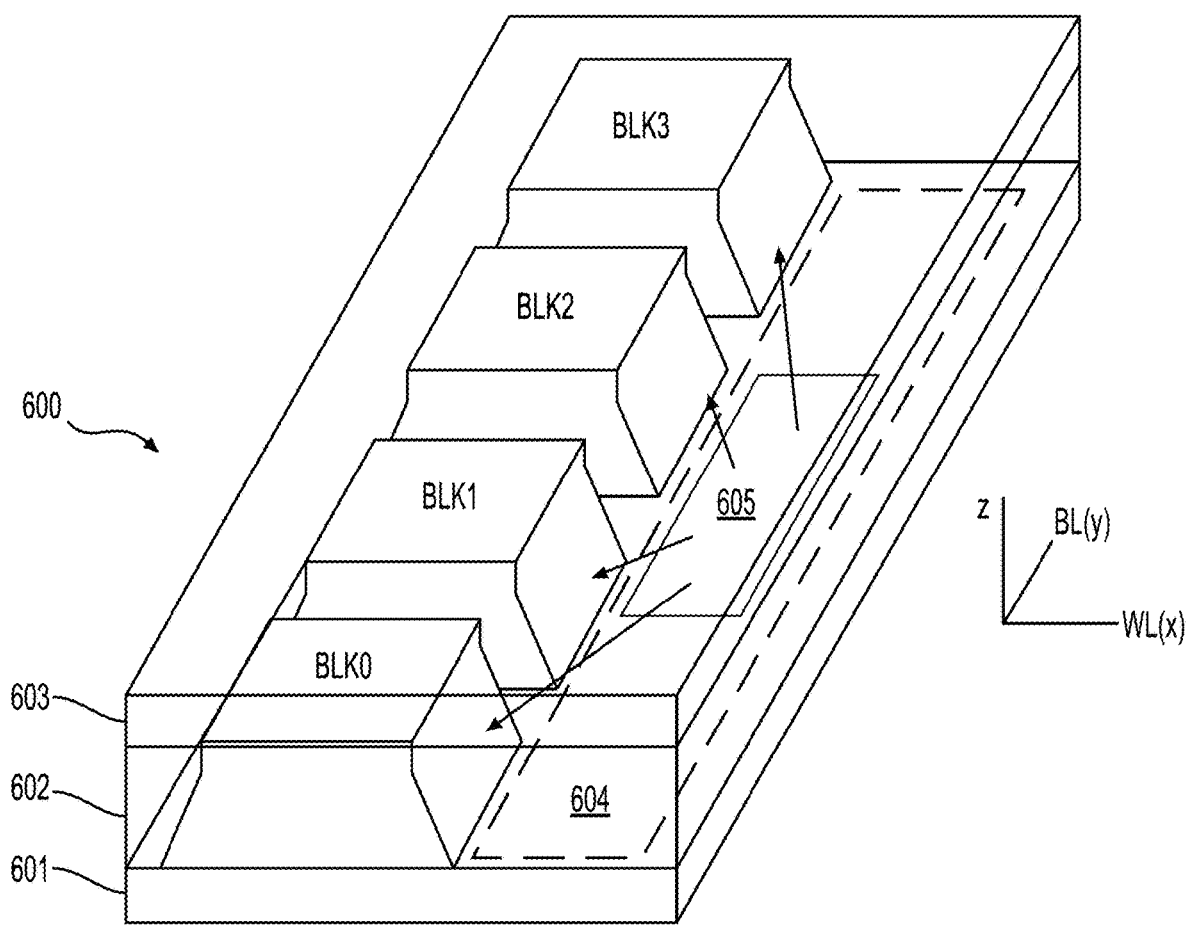
FIG. 6A is a perspective view of a set of blocks in an example three-dimensional configuration of the memory array of FIG. 1 according to aspects of the disclosure.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
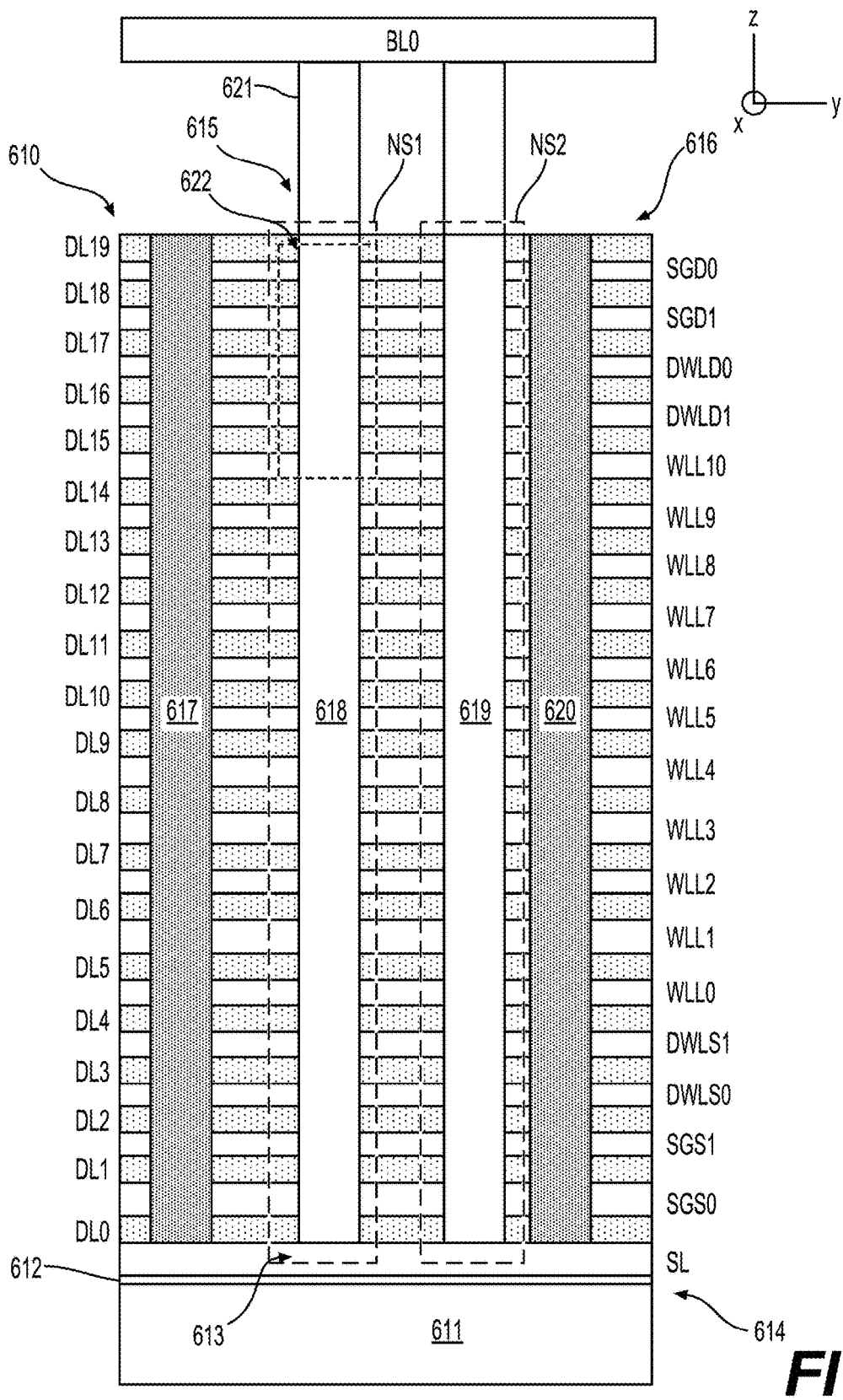
FIG. 6B illustrates an example cross-sectional view of a portion of one of the blocks of FIG. 6A according to aspects of the disclosure.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
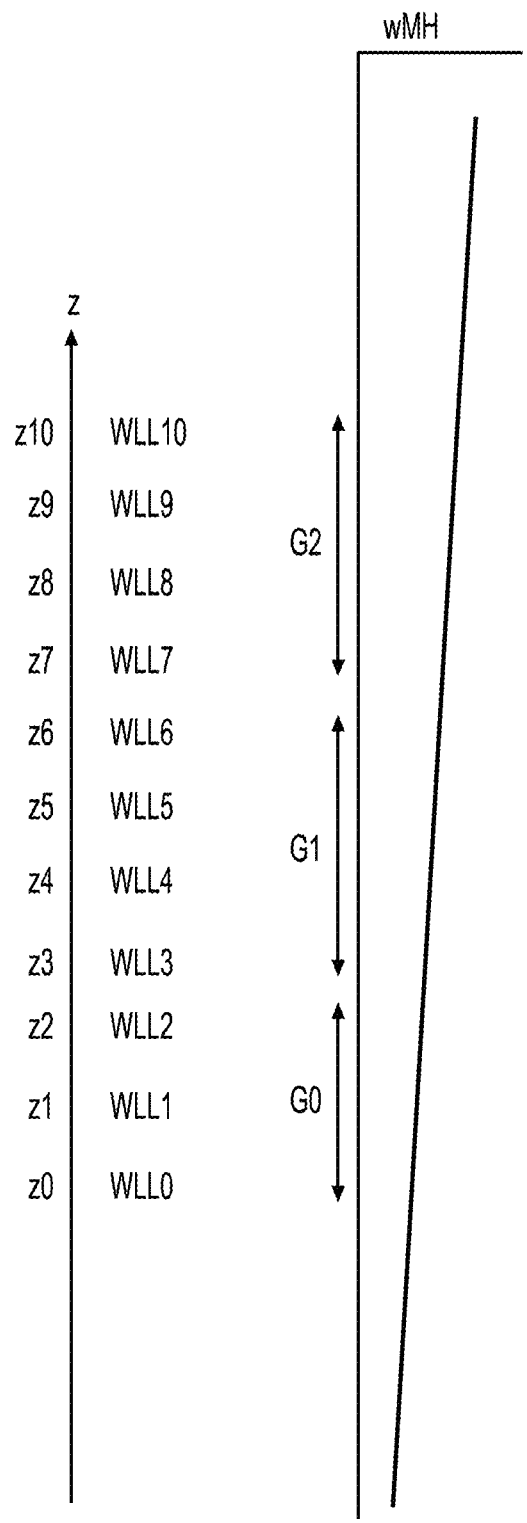
FIG. 6C illustrates a plot of memory hole diameter in the stack of FIG. 6B according to aspects of the disclosure.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
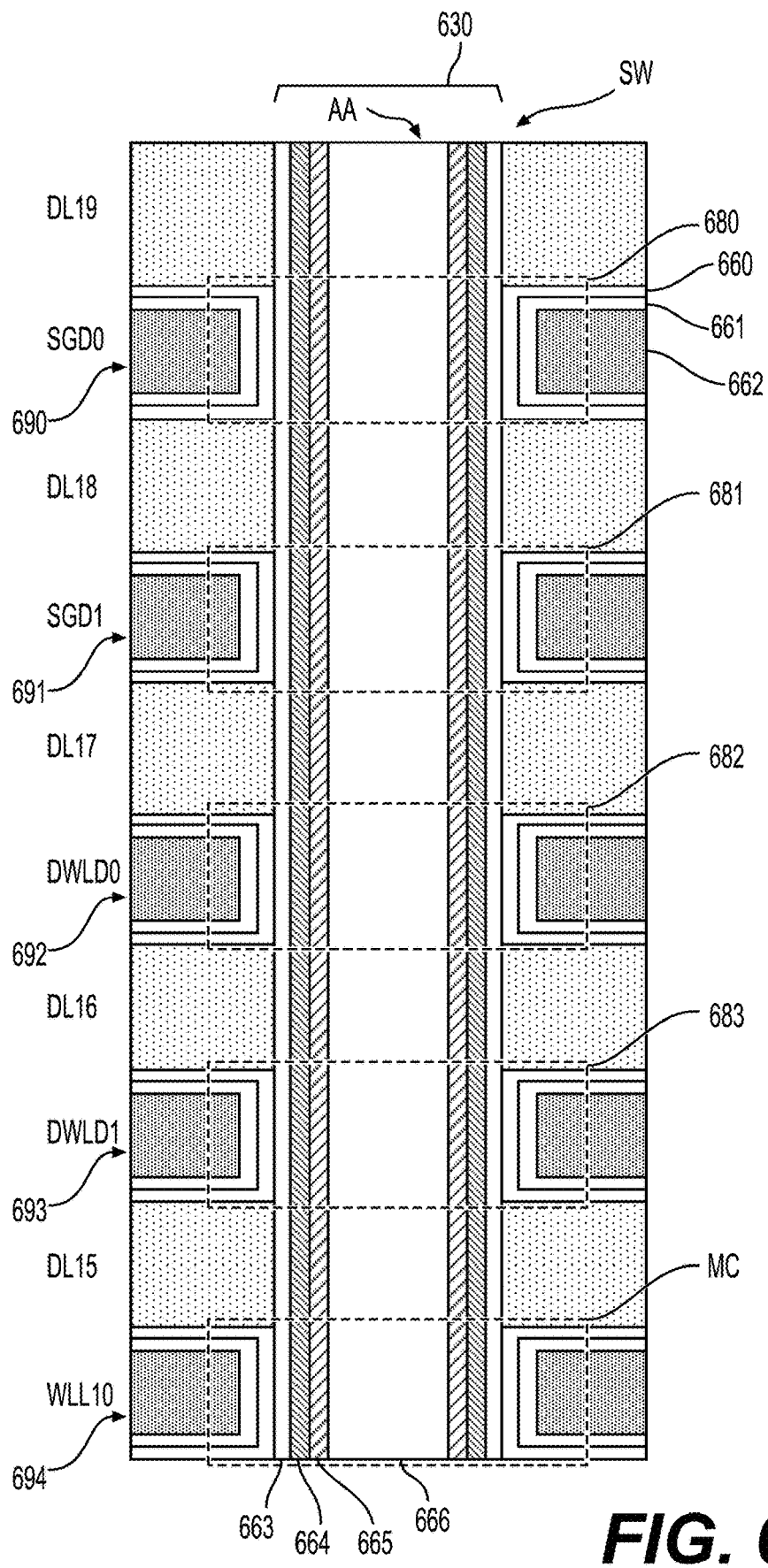
FIG. 6D illustrates a close-up view of the region of the stack of FIG. 6B according to aspects of the disclosure.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge-trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

Figure 7A:
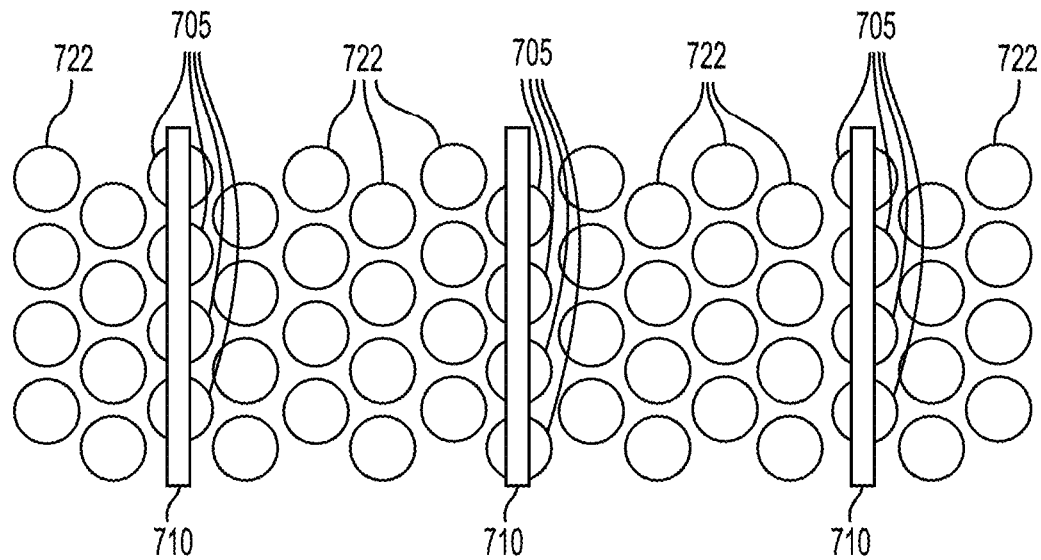
FIG. 7A illustrates a schematic plan view of a memory array with a plurality of memory holes according to aspects of the disclosure.

FIG. 7A shows a schematic plan view of a memory array 700 with a plurality of memory holes 722, which can be vertical memory cell strands as described herein, and a plurality of dummy holes 705, which need not one complete memory structures. A shallow trench etch or shallow etching feature (SHE) 710 extends through a plurality of word lines (for example, five) but not fully through the chip to electrically isolate adjacent strings from one another. The SHE extends directly through a group of aligned dummy holes 705, thereby preventing those dummy holes 705 from storing data or otherwise being functional memory cells.

Figure 7B:
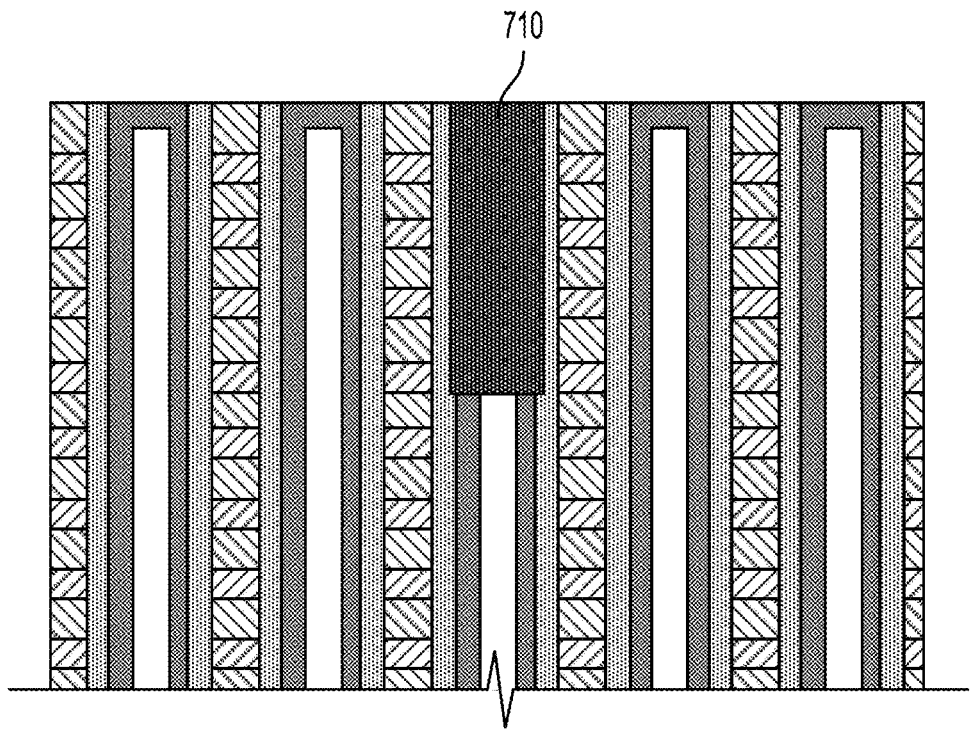
FIG. 7B illustrates a cross-sectional view of the memory array according to aspects of the disclosure.
Figure 8A:
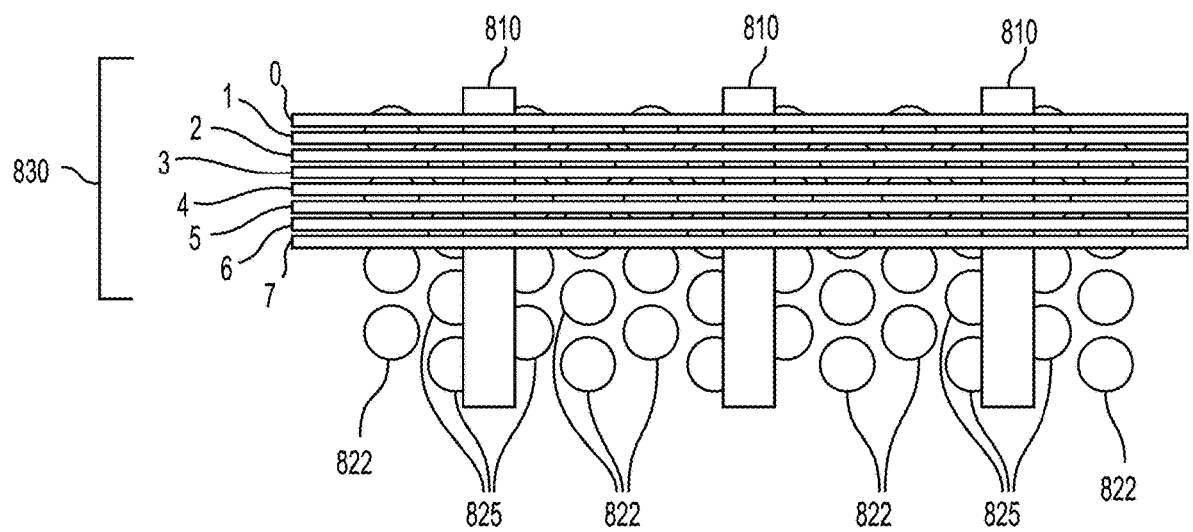
FIGS. 8A and 8B illustrate an alternate memory structure with no dummy holes according to aspects of the disclosure.
Figure 8B:
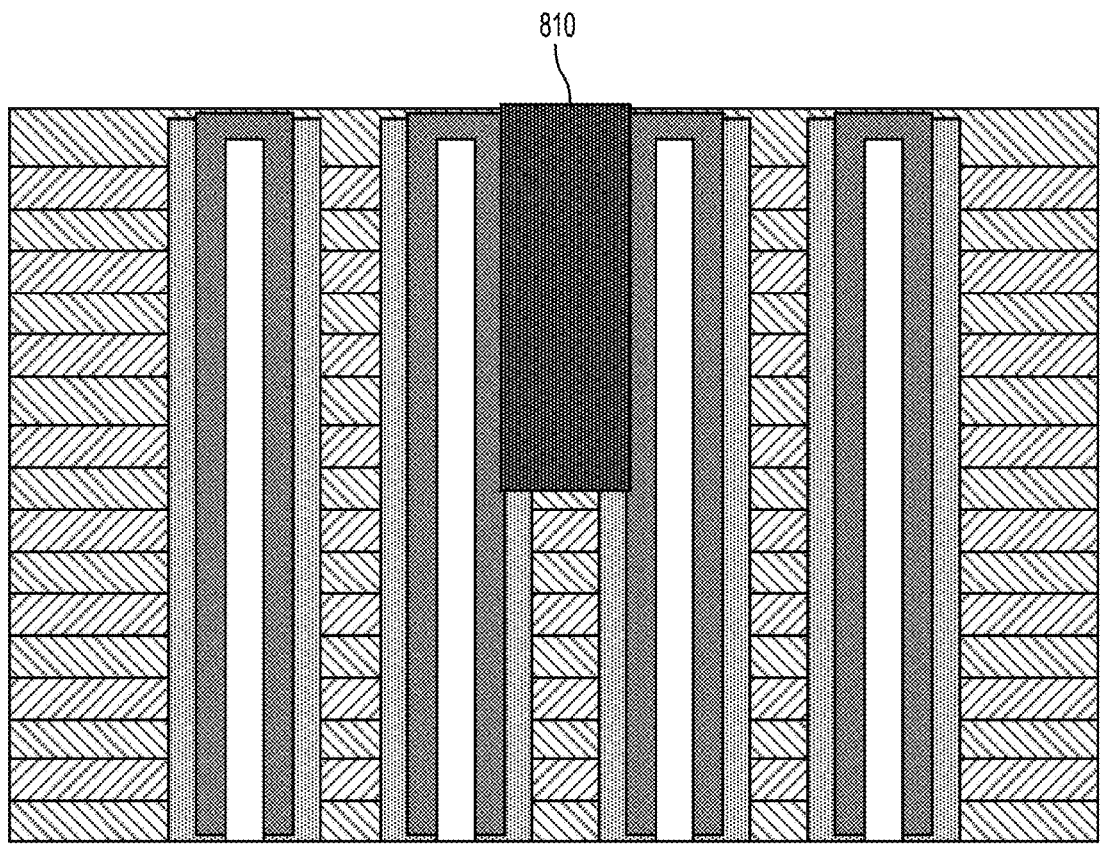

Referring now to FIGS. 8A and 8B, there are no dummy holes. Unlike the memory structure 700 of FIGS. 7A and 7B, the SHE 810 is located in a gap between two adjacent rows of memory cells 825 and overlaps with memory holes 825, thereby creating a working strand that has a trench etched down into a side of at least the SGD switch at the top of the working memory strand, here shown as memory holes 825. This configuration substantially improves yield and memory density as all of the memory holes 822, 825 are functional, i.e., fewer memory holes are wasted.

Unlike the fully circular memory holes 822, the memory holes 825 and the SGD switches that are partially cut by the SHE 810 have a semi-circular shape, which can either be a half circle or can be more or less than a half-circle. In some cases, the memory holes 825 and SGD switches can be less than half circles on one side of the SHE 810 and more than half circles on the other side of the SHE 810.

The memory holes 822, 825 are connected with a plurality of bit lines 830 (labeled as bit lines 0-7 in FIG. 8A). For ease of illustration, only eight bit lines 830 have been shown. The bit lines 830 extend over above the memory holes and are connected to select memory holes via connection points. The memory holes in each string area also connected at one end to an SGD switch and at the other end to an SGS switch. The SHE trench 810 may be etched into a portion of the SGD switch.

Figure 9A:
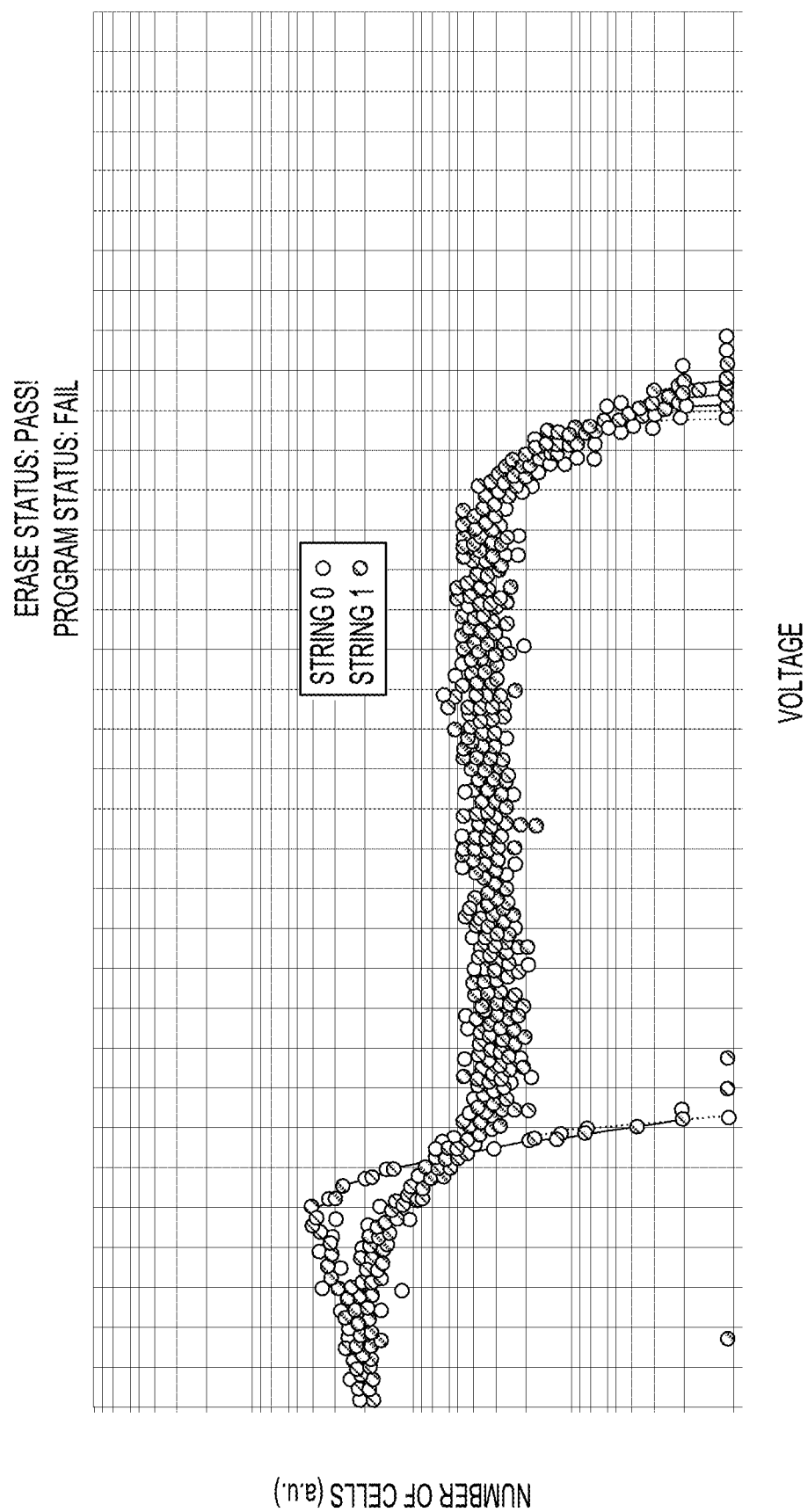
FIGS. 9A-9B show a threshold voltage distributions of four strings of memory cells after an experimental failure is created during an erase operation according to aspects of the disclosure.
Figure 9B:
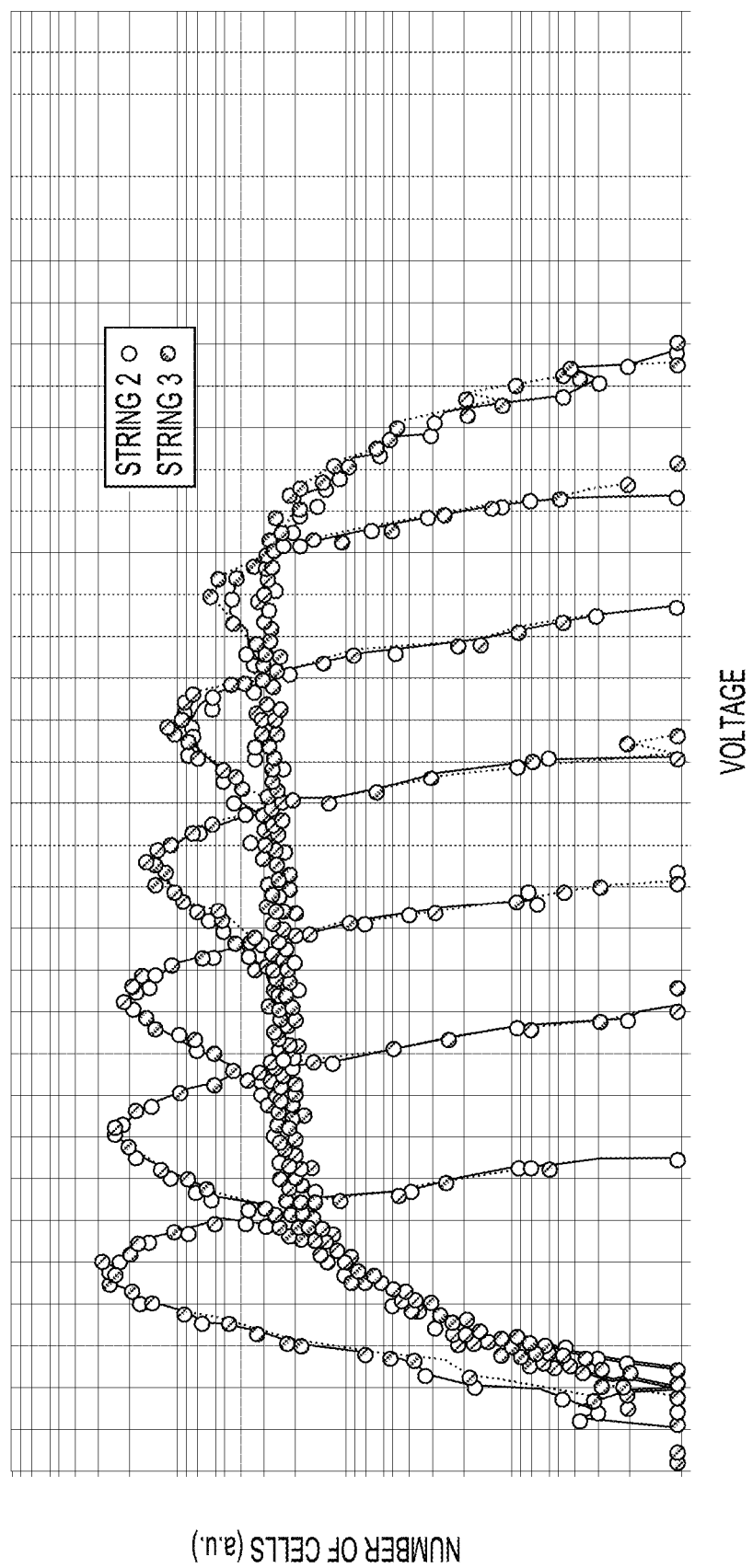
Figure 10:
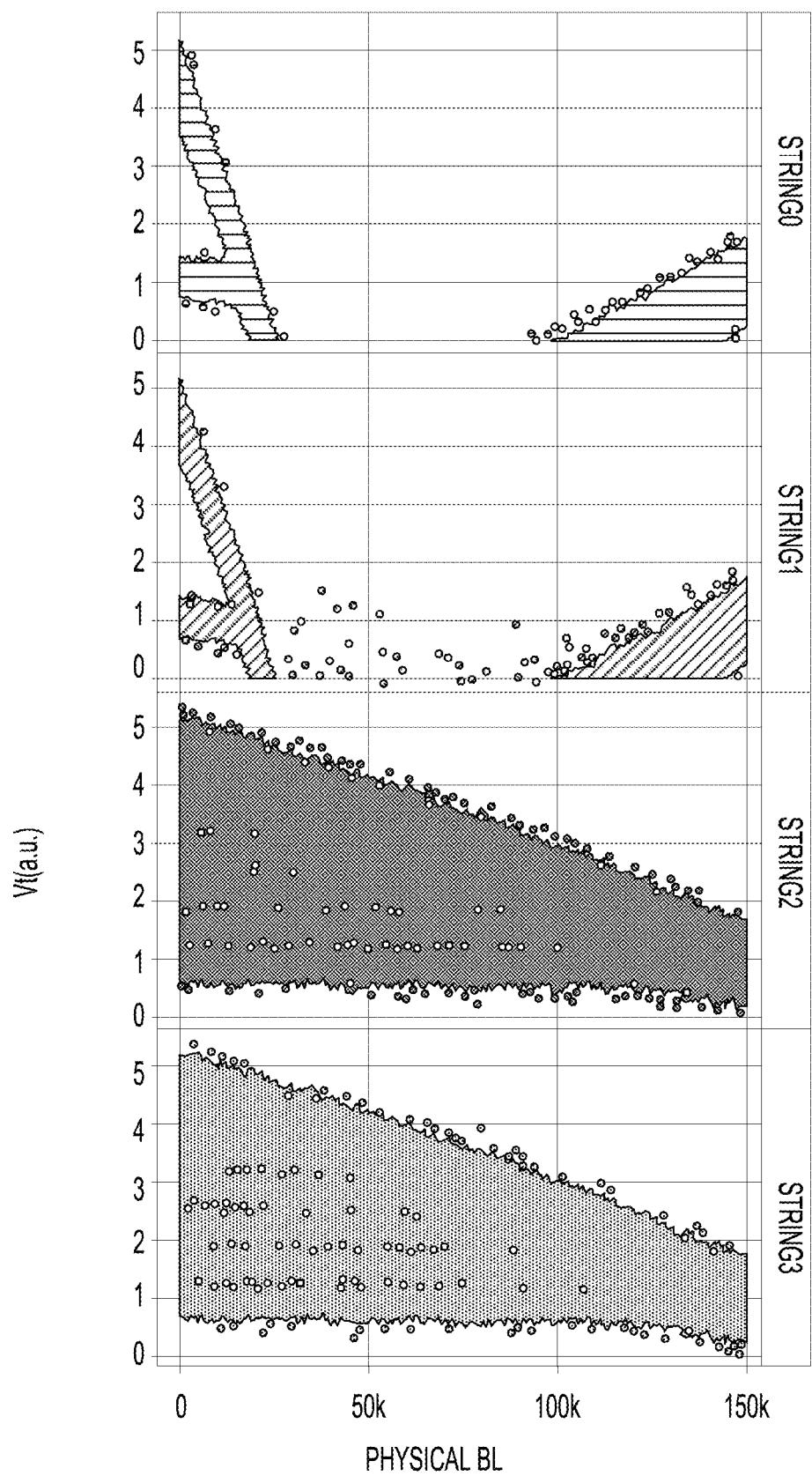
FIG. 10 shows plots of the threshold voltage versus the physical bit line for each of the four strings of memory cells for the experimental failure according to aspects of the disclosure.
Figure 11:
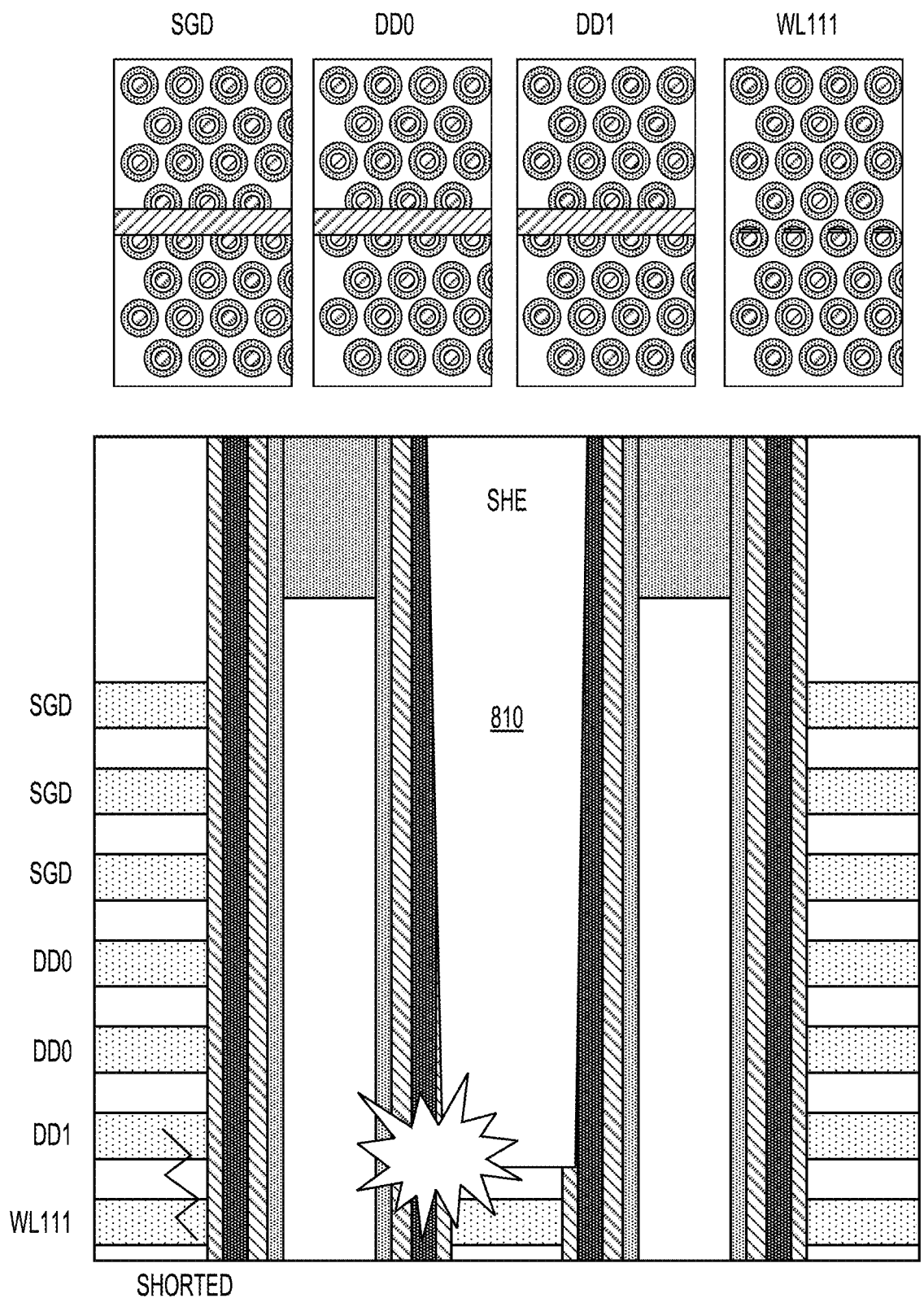
FIG. 11 shows a memory apparatus with a short between a dummy word line and a data word line adjacent a SHE cut and a top view of layers of the memory apparatus showing the SHE cut according to aspects of the disclosure.
Figure 13:
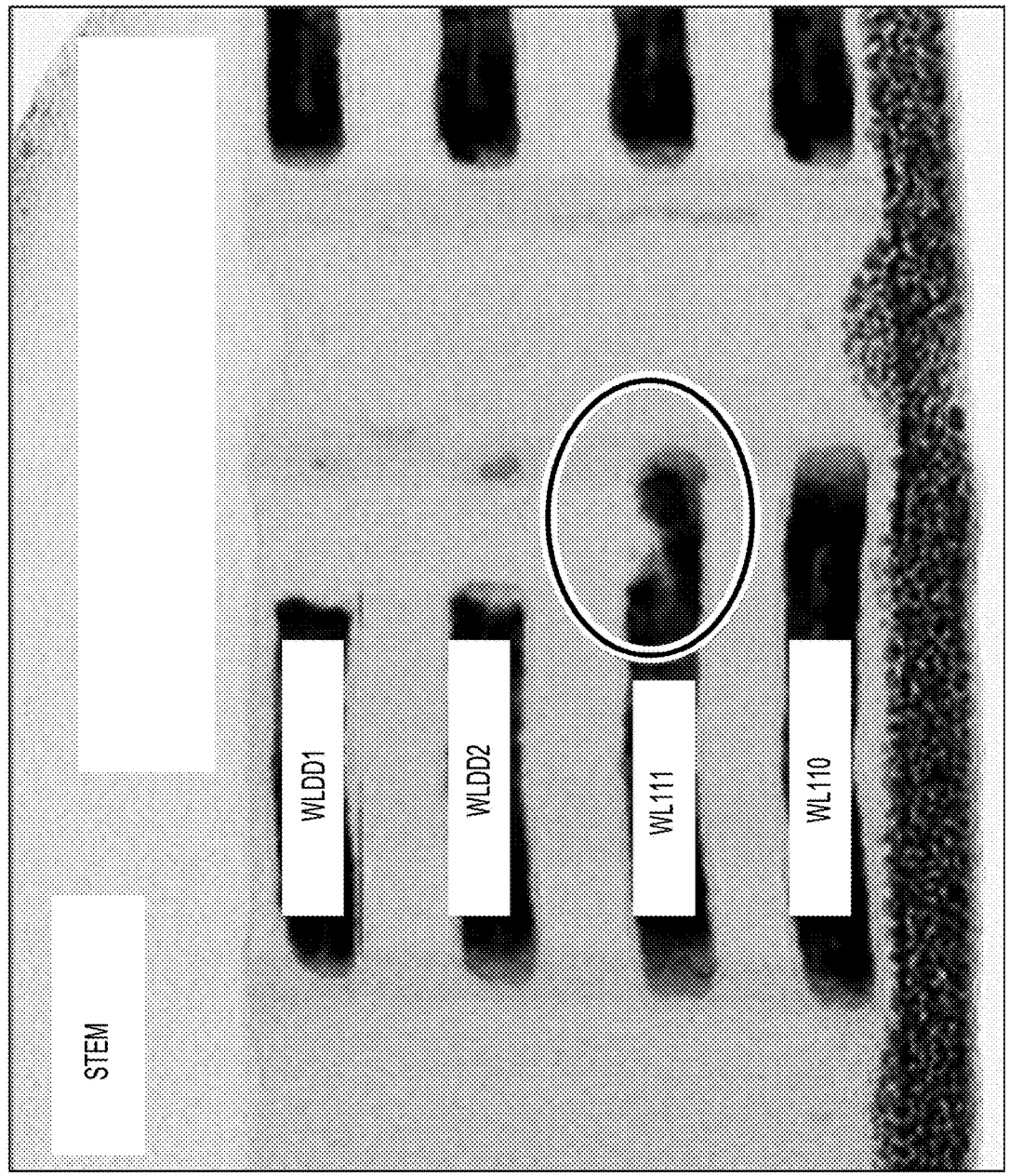
FIGS. 13 and 14 show cross-sectional and top views close up views of an edge word line and a dummy word line short circuit for the experimental failure according to aspects of the disclosure.
Figure 14:
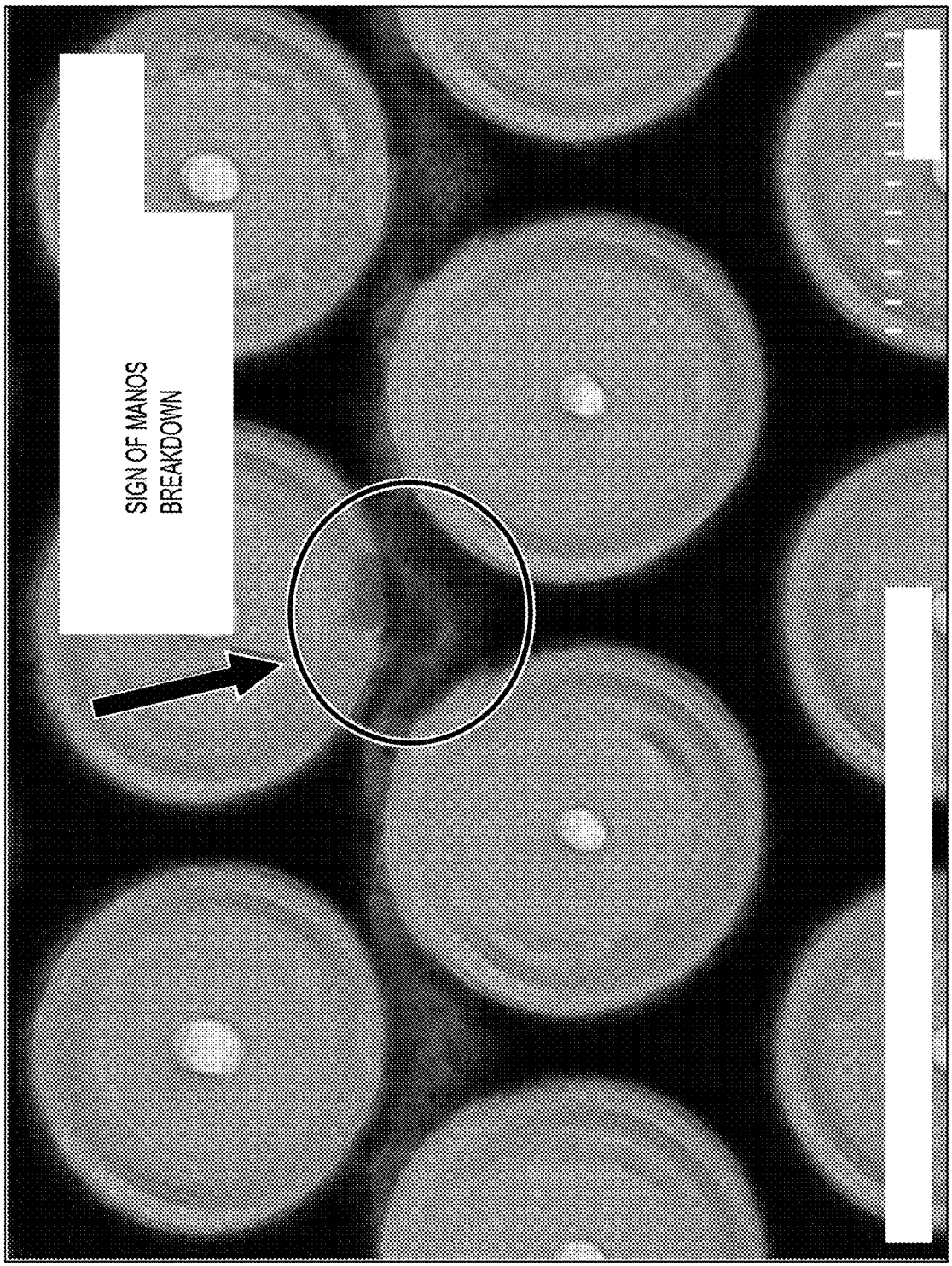

As discussed above, it may not be possible to avoid data corruption or detect bad blocks immediately using erase status. Specifically, while blocks with SHE cut induced damage (e.g., short circuits) can still pass the erase operation (erase status "pass"), such damage causes subsequent program failure. FIGS. 9A-9B show threshold voltage Vt distributions of four strings of memory cells after an experimental failure is created during an erase operation. FIG. 10 shows plots of the threshold voltage Vt versus the physical bit line for each of the four strings of memory cells for the experimental failure. FIG. 11 shows a memory apparatus with a short between a dummy word line DD1 and a data word line WL111 (lower portion of FIG. 11) adjacent a SHE cut 810 and a top view (upper portion of FIG. 11) of layers of the memory apparatus showing the SHE cut 810. FIG. 12 illustrates that there is a leak current for one of the data word lines WL111 and a dummy word line DD1, but not for other data word lines WL110, WL109 or dummy word line DD0. FIGS. 13 and 14 show cross-sectional and top views close up views of and edge word line WL111 and dummy word line DD1 short circuit for the experimental failure (circled areas show damage or breakdown). So, the experimental failure of FIGS. 9A-14 was created during an erase operation. However, since the edge word line WL111 and dummy word line DD1 are shorted, they can easily pass erase verify (dummy word line DD1 is always biased high ~6 a.u. during erase verify). As a result, the erase operation passes. If this failure cannot be detected on the during the erase operation (i.e., on the fly), the block cannot be marked as grown bad block (GBB) immediately. As a result, further data is allowed to be written until program fail. Such a failure is not desirable, since data may be lost.

Consequently, described herein is a memory apparatus (e.g., memory device 100 of FIG. 1A) including memory cells (e.g., data memory cell MC and dummy memory cells 682, 683 of FIG. 6D) connected to one of a plurality of word lines (e.g., data word line layers (word lines) WLL0-WLL10 of FIG. 6B or WLL10 of FIG. 6D). The memory cells are arranged in one or more strings (e.g., NAND strings NS1 and NS2 of FIG. 6B) and configured to retain a threshold voltage Vt or Vth. The memory apparatus also includes a control circuit or means (e.g., one or any combination of control circuitry 110, decoders 114/132, power control module 116, sense blocks SBb, SB2, . . . , SBp, read/write circuits 128, controller 122 of FIG. 1A, control circuit 150 of FIG. 1B, and/or sense circuit controller 560 of FIG. 5 and so forth) coupled to the plurality of word lines and the strings. The control means is configured to apply an erase voltage to each of the strings while simultaneously grounding the plurality of word lines to encourage erasing of the memory cells corresponding with the plurality of word lines during the erase operation in response to receiving an erase command. The control means is also configured to apply an erase verify voltage to the plurality of word lines. The control means determines whether the memory cells connected to the plurality of word lines have the threshold voltage Vt less than or equal to the erase verify voltage. The control means is also configured to increase the erase voltage and return to apply the erase voltage to each of the strings while simultaneously grounding the plurality of word lines to encourage erasing of the memory cells corresponding with the plurality of word lines during the erase operation in response to the memory cells connected to the plurality of word lines having the threshold voltage Vt not less than or equal to the erase verify voltage.

The control means is also configured to apply a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location. The control means determines the erase operation passed in response to the leak current measured not being greater than a predetermined leak threshold. So, for example, the control means applies the primary predetermined voltage (e.g., 5 a.u.) to the primary location of the memory apparatus following the erase operation of the memory cells while simultaneously applying the secondary predetermined voltage (e.g., 0 a.u.) being lower than the primary predetermined voltage to the secondary location and measures the leak current at the primary location in response to the memory cells connected to the plurality of word lines having the threshold voltage Vt less than or equal to the erase verify voltage.

Referring back to FIG. 6B, for example, the plurality of word lines (e.g., word line layers (word lines) WLL0-WLL10 of FIG. 6B) and a plurality of dielectric layers (e.g., DL0-DL19 of FIG. 6B) extend horizontally and overlay one another in an alternating fashion in a stack (e.g., stack 610) and the strings (e.g., NAND strings NS1 and NS2 of FIG. 6B) extend vertically through the stack. The memory cells are connected in series between at least one drain-side select gate SGD transistor on a drain-side of each of the strings (e.g., at SGD0 or SGD1 layers) and connected to one of a plurality of bit lines (e.g., BL0 of FIG. 6B) and at least one source-side select gate SGS transistor on a source-side of each of the strings (e.g., at SGS0 or SGS1 layers) and connected to a source line (e.g., SL of FIG. 6B). The plurality of word lines include at least one dummy word line (e.g., DWLD0 and DWLD1 of FIG. 6B) being disposed immediately adjacent the at least one drain-side select gate SGD transistor and an edge word line being disposed vertically below the at least one dummy word line (e.g., WLL10 of FIG. 6B).

Figure 15:
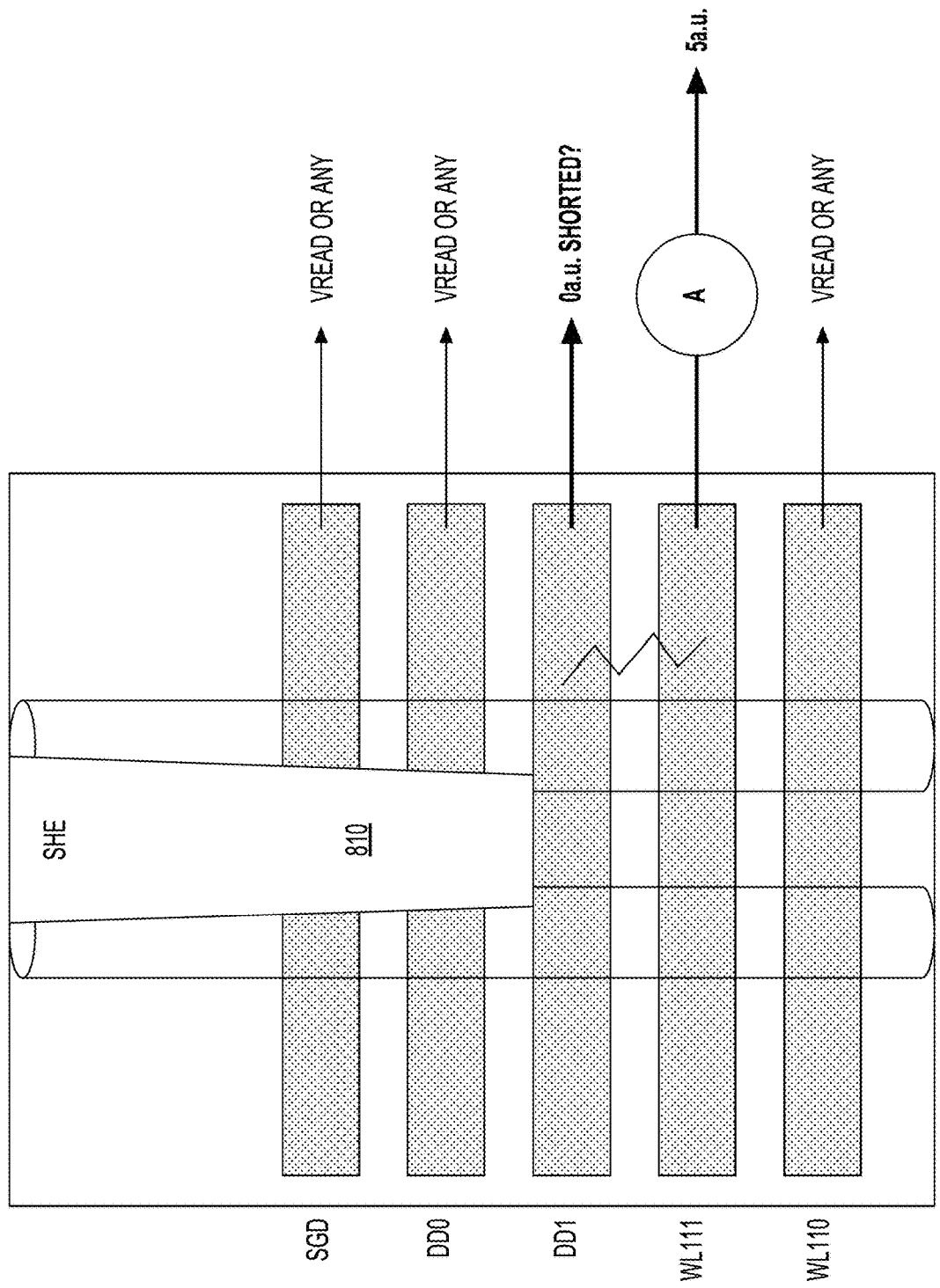
FIG. 15 shows a cross-sectional view of a plurality of word lines and a drain-side select gate layer showing an example short between a dummy word line an edge word line according to aspects of the disclosure.

FIG. 15 shows a cross-sectional view of a plurality of word lines and a drain-side select gate SGD layer with an example short between a dummy word line an edge word line. The control means is further configured to apply a read voltage VREAD to the at least one drain-side select gate SGD transistor and the at least one source-side select gate SGS transistor and other ones of the plurality of word lines beside the primary location and the secondary location when the secondary location is one of the plurality of word lines. In addition, the control means is configured to apply the read voltage VREAD to the at least one drain-side select gate SGD transistor and the at least one source-side select gate SGS transistor and other ones of the plurality of word lines beside the primary location when the secondary location is one of the source line and the plurality of bit lines.

According to an aspect, the primary location is the edge word line and the secondary location is the at least one dummy word line disposed immediately adjacent the edge word line in the stack. Still referring to FIG. 15, the short that is shown is between the edge word line WL111 and the dummy word line DD1. Thus, the memory apparatus and method discussed herein involve a proactive leak detection after an erase operation (here the leak is detection is carried out between edge word line and dummy word line). As a result, the control means can immediately detect if the edge word line to dummy word line short occurs due to high electrical field of erase. So, as discussed above, the technique includes two steps: 1. Conventional erase/verify, and 2. After (conventional) erase status pass, detect edge word line (e.g., WL111) to dummy word line (e.g., DD1) leakage by biasing the edge word line to the primary predetermined voltage (e.g., 5 a.u.), biasing the dummy word line to the secondary predetermined voltage (e.g., 0 a.u.) and monitoring the direct current (DC) current at the edge WL (e.g. WL111). If the control means detects a short or leak (DC current is relatively high), then the control means or memory apparatus will return "erase fail" and allow control means or controller to immediately mark the block as bad (i.e., GBB). If the short or leak is not detected (DC current is relatively low), then the control means or memory apparatus will return "erase pass".

Failures in OPS technology described herein (i.e., short circuits) typically only happen at the edge word line (e.g., WL111). However, failures or short circuits may be found elsewhere in the stack. Referring back to FIG. 6B, for example, the plurality of word lines (e.g., WLL0-WLL10 in FIG. 6B) includes a plurality of other data word lines (e.g., WLL0-WLL9 in FIG. 6B) disposed vertically below the edge word line (e.g., WLL0 in FIG. 6B) in the stack and the control means is further configured to recursively apply the primary predetermined voltage to each of a first one of the plurality of other data word lines while simultaneously applying the secondary predetermined voltage being lower than the primary predetermined voltage to each of a second one of the plurality of other data word lines disposed vertically above the first one of the plurality of other data word lines and measuring a leak current at each of the first one of the plurality of other data word lines. The control means is also configured to determine the erase operation passed in response to the leak current measured at all of the first one of the plurality of other data word lines not being greater than the predetermined leak threshold. In other words, the techniques discussed herein can be easily generalized a broader application. Again, there are two steps: 1. Conventional erase/verify, and 2. After (conventional) erase status pass, detect leakage between the first word line (i.e., the first one of the plurality of other data word lines) and second word line (i.e., the second one of the plurality of other data word lines) by biasing the first word line to the primary predetermined voltage (e.g., 5 a.u.) and the second word line to the secondary predetermined voltage (e.g., 0 a.u.) and monitoring the leak current (DC) at the first word line. If the control means detects a short or leak (DC current is relatively high), then the control means or memory apparatus will return "erase fail" and allow control means or controller to immediately mark the block as bad (i.e., GBB). If the short or leak is not detected (DC current is relatively low), then the process is repeated to check for a short between the third word line (i.e., the first one of the plurality of other data word lines) and the fourth word line (i.e., the second one of the plurality of other data word lines), fifth word line (i.e., the first one of the plurality of other data word lines) and sixth word line (i.e., the second one of the plurality of other data word lines), etc. If no leak is detected, then the control means will return "erase pass".

So, the primary location has been discussed as, for example, the edge word line and the secondary location has been discussed as the at least one dummy word line. In the other example discussed above, the primary location is the first word line and the secondary location is the second word line recursively checked through the stack. However, it should be appreciated that the control means may detect shorts elsewhere in the memory apparatus or stack. According to another aspect, the primary location is one of the plurality of word lines and the secondary location is the one of the plurality of bit lines. According to yet another aspect, the primary location is one of the plurality of word lines and the secondary location is the source line.

Figure 16:
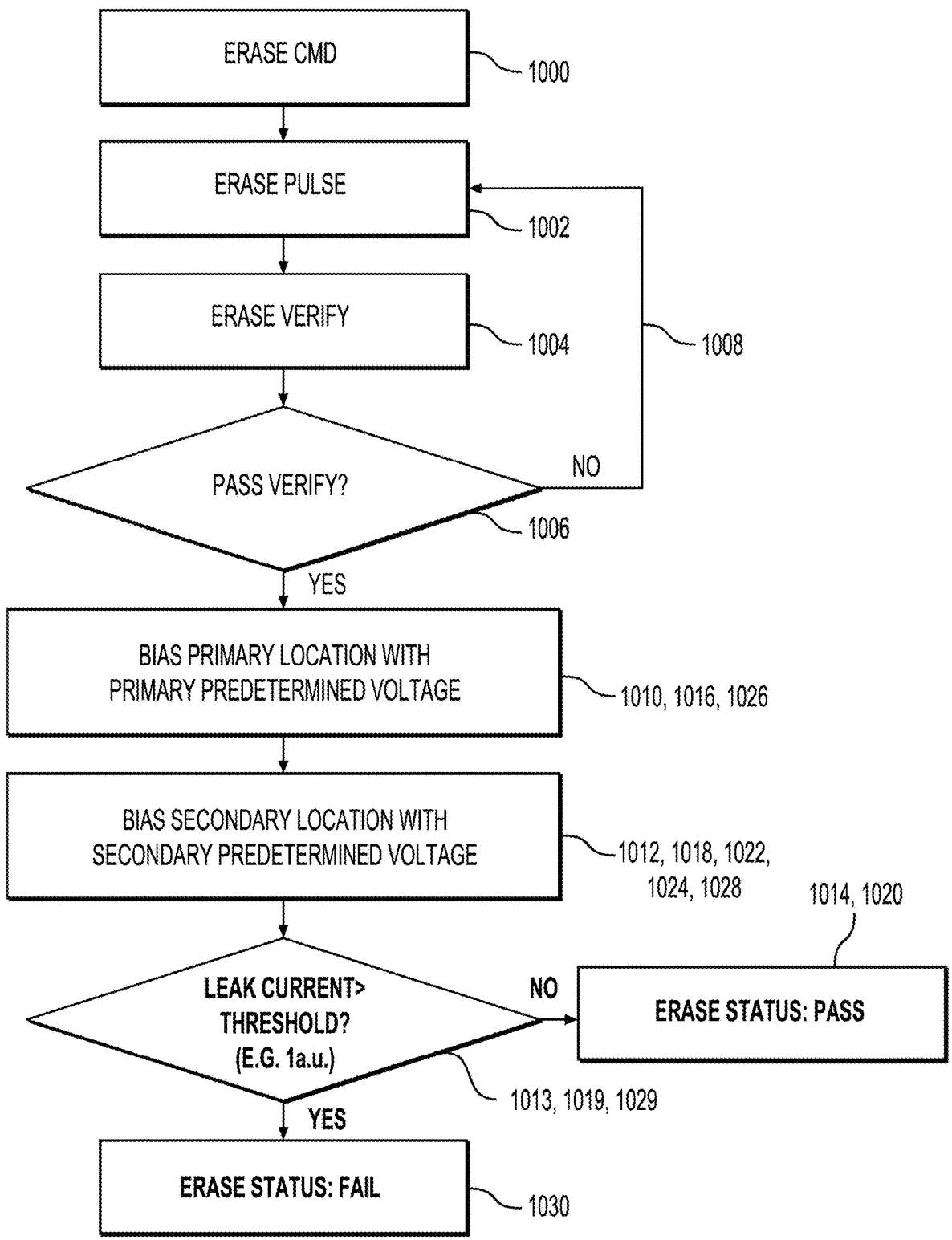
FIG. 16 illustrates steps of a method of operating a memory apparatus according to aspects of the disclosure.

FIG. 16 illustrates steps of a method of operating a memory apparatus. As discussed above, the memory apparatus (e.g., memory device 100 of FIG. 1A) includes including memory cells (e.g., data memory cell MC and dummy memory cells 682, 683 of FIG. 6D) connected to one of a plurality of word lines (e.g., data word line layers (word lines) WLL0-WLL10 of FIG. 6B or WLL10 of FIG. 6D). The memory cells are arranged in one or more strings (e.g., NAND strings NS1 and NS2 of FIG. 6B) and configured to retain a threshold voltage Vt or Vth. The method includes the step of 1000 receiving an erase command for an erase operation. The next step of the method is 1002 applying an erase voltage to each of the strings while simultaneously grounding the plurality of word lines to encourage erasing of the memory cells corresponding with the plurality of word lines during the erase operation in response to receiving an erase command for the erase operation. The method proceeds with the step of 1004 applying an erase verify voltage to the plurality of word lines. The method continues by 1006 determining whether the memory cells connected to the plurality of word lines have the threshold voltage Vt less than or equal to the erase verify voltage. Next, 1008 increasing the erase voltage and returning to 1002 applying the erase voltage to each of the strings while simultaneously grounding the plurality of word lines to encourage erasing of the memory cells corresponding with the plurality of word lines during the erase operation in response to the memory cells connected to the plurality of word lines having the threshold voltage Vt not less than or equal to the erase verify voltage.

The method also includes the step of 1010 applying a primary predetermined voltage to a primary location of the memory apparatus following an erase operation of the memory cells. The method additionally includes the steps of 1012 simultaneously applying a secondary predetermined voltage being lower than the primary predetermined voltage to a secondary location of the memory apparatus and 1013 measuring a leak current at the primary location. The method continues by 1014 determining the erase operation passed in response to the leak current measured not being greater than a predetermined leak threshold.

Again, the plurality of word lines (e.g., word line layers (word lines) WLL0-WLL10 of FIG. 6B) and the plurality of dielectric layers (e.g., DL0-DL19 of FIG. 6B) extend horizontally and overlay one another in an alternating fashion in the stack (e.g., stack 610) and the strings (e.g., NAND strings NS1 and NS2 of FIG. 6B) extend vertically through the stack. The memory cells are connected in series between the at least one drain-side select gate SGD transistor on the drain-side of each of the strings (e.g., at SGD0 or SGD1 layers) and connected to one of a plurality of bit lines (e.g., BL0 of FIG. 6B) and the at least one source-side select gate SGS transistor on the source-side of each of the strings (e.g., at SGS0 or SGS1 layers) and connected to a source line (e.g., SL of FIG. 6B). The plurality of word lines include the at least one dummy word line (e.g., DWLD0 and DWLD1 of FIG. 6B) being disposed immediately adjacent the at least one drain-side select gate SGD transistor and the edge word line being disposed vertically below the at least one dummy word line (e.g., WLL10 of FIG. 6B). According to an aspect, the primary location is the edge word line and the secondary location is the at least one dummy word line disposed immediately adjacent the edge word line in the stack.

As discussed, the plurality of word lines includes a plurality of other data word lines disposed vertically below the edge word line in the stack. Thus, in more detail, the method further includes the step of 1016 recursively applying the primary predetermined voltage to each of a first one of the plurality of other data word lines. The method continues by 1018 simultaneously applying the secondary predetermined voltage being lower than the primary predetermined voltage to each of a second one of the plurality of other data word lines disposed vertically above the first one of the plurality of other data word lines. The method also includes the step of 1019 measuring a leak current at each of the first one of the plurality of other data word lines. The method proceeds with the step of 1020 determining the erase operation passed in response to the leak current measured at all of the first one of the plurality of other data word lines not being greater than the predetermined leak threshold.

As mentioned, the primary location is one of the plurality of word lines and the secondary location is the one of the plurality of bit lines. Alternatively, the primary location is one of the plurality of word lines and the secondary location is the source line. Other primary and secondary locations are contemplated.

The method further includes the step of 1022 applying a read voltage VREAD to the at least one drain-side select gate SGD transistor and the at least one source-side select gate SGS transistor and other ones of the plurality of word lines beside the primary location and the secondary location when the secondary location is one of the plurality of word lines. The method additionally includes the step of 1024 applying the read voltage VREAD to the at least one drain-side select gate SGD transistor and the at least one source-side select gate SGS transistor and other ones of the plurality of word lines beside the primary location when the secondary location is one of the source line and the plurality of bit lines.

The method also includes the step of 1026 applying the primary predetermined voltage to the primary location of the memory apparatus following the erase operation of the memory cells. The method also includes the step of 1028 simultaneously applying the secondary predetermined voltage being lower than the primary predetermined voltage to the secondary location. Next, 1029 measuring the leak current at the primary location in response to the memory cells connected to the plurality of word lines having the threshold voltage Vt less than or equal to the erase verify voltage. The method also includes the step of 1030 determining the erase operation failed in response to the leak current measured being greater than the predetermined leak threshold.

The advantages of the memory apparatus and method disclosed herein include making OPS technology more viable and detect SHE cut induced issue immediately. Additionally, the memory apparatus and method disclosed herein only adds a negligible erase performance overhead. Typical erase time is approximately 5 m.a.u., this extra detection will take only approximately 50 u.a.u.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A memory apparatus, comprising:
   memory cells connected to one of a plurality of word lines and arranged in strings and configured to retain a threshold voltage; and
   a control means coupled to the plurality of word lines and the strings and configured to:
      apply a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location, and
      determine the erase operation passed in response to the leak current measured not being greater than a predetermined leak threshold.

2. The memory apparatus as set forth in claim 1, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed immediately adjacent the at least one drain-side select gate transistor and an edge word line being disposed vertically below the at least one dummy word line, and the primary location is the edge word line and the secondary location is the at least one dummy word line disposed immediately adjacent the edge word line in the stack.

3. The memory apparatus as set forth in claim 2, wherein the plurality of word lines includes a plurality of other data word lines disposed vertically below the edge word line in the stack and the control means is further configured to:
recursively apply the primary predetermined voltage to each of a first one of the plurality of other data word lines while simultaneously applying the secondary predetermined voltage being lower than the primary predetermined voltage to each of a second one of the plurality of other data word lines disposed vertically above the first one of the plurality of other data word lines and measuring a leak current at each of the first one of the plurality of other data word lines, and
determine the erase operation passed in response to the leak current measured at all of the first one of the plurality of other data word lines not being greater than the predetermined leak threshold.

4. The memory apparatus as set forth in claim 1, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the primary location is one of the plurality of word lines and the secondary location is the one of the plurality of bit lines.

5. The memory apparatus as set forth in claim 1, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the primary location is one of the plurality of word lines and the secondary location is the source line.

6. The memory apparatus as set forth in claim 1, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the control means is further configured to:
apply a read voltage to the at least one drain-side select gate transistor and the at least one source-side select gate transistor and other ones of the plurality of word lines beside the primary location and the secondary location when the secondary location is one of the plurality of word lines; and
apply the read voltage to the at least one drain-side select gate transistor and the at least one source-side select gate transistor and other ones of the plurality of word lines beside the primary location when the secondary location is one of the source line and the plurality of bit lines.

7. The memory apparatus as set forth in claim 1, wherein the control means is further configured to:
apply an erase voltage to each of the strings while simultaneously grounding the plurality of word lines to encourage erasing of the memory cells corresponding with the plurality of word lines during the erase operation in response to receiving an erase command;
apply an erase verify voltage to the plurality of word lines;
determine whether the memory cells connected to the plurality of word lines have the threshold voltage less than or equal to the erase verify voltage;
increase the erase voltage and return to apply the erase voltage to each of the strings while simultaneously grounding the plurality of word lines to encourage erasing of the memory cells corresponding with the plurality of word lines during the erase operation in response to the memory cells connected to the plurality of word lines having the threshold voltage not less than or equal to the erase verify voltage;
apply the primary predetermined voltage to the primary location of the memory apparatus following the erase operation of the memory cells while simultaneously applying the secondary predetermined voltage being lower than the primary predetermined voltage to the secondary location and measuring the leak current at the primary location in response to the memory cells connected to the plurality of word lines having the threshold voltage less than or equal to the erase verify voltage; and
determine the erase operation failed in response to the leak current measured being greater than the predetermined leak threshold.

8. A controller in communication with a memory apparatus including memory cells connected to one of a plurality of word lines and arranged in strings and configured to retain a threshold voltage, the controller configured to:
instruct the memory apparatus to apply a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location; and determine the erase operation passed in response to the leak current measured not being greater than a predetermined leak threshold.

9. The controller as set forth in claim 8, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed immediately adjacent the at least one drain-side select gate transistor and an edge word line being disposed vertically below the at least one dummy word line, and the primary location is the edge word line and the secondary location is the at least one dummy word line disposed immediately adjacent the edge word line in the stack.

10. The controller as set forth in claim 9, wherein the plurality of word lines includes a plurality of other data word lines disposed vertically below the edge word line in the stack and the controller is further configured to:
instruct the memory apparatus to recursively apply the primary predetermined voltage to each of a first one of the plurality of other data word lines while simultaneously applying the secondary predetermined voltage being lower than the primary predetermined voltage to each of a second one of the plurality of other data word lines disposed vertically above the first one of the plurality of other data word lines and measuring a leak current at each of the first one of the plurality of other data word lines, and
determine the erase operation passed in response to the leak current measured at all of the first one of the plurality of other data word lines not being greater than the predetermined leak threshold.

11. The controller as set forth in claim 8, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the primary location is one of the plurality of word lines and the secondary location is the one of the plurality of bit lines.

12. The controller as set forth in claim 8, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the controller is further configured to:
instruct the memory apparatus to apply a read voltage to the at least one drain-side select gate transistor and the at least one source-side select gate transistor and other ones of the plurality of word lines beside the primary location and the secondary location when the secondary location is one of the plurality of word lines; and
instruct the memory apparatus to apply the read voltage to the at least one drain-side select gate transistor and the at least one source-side select gate transistor and other ones of the plurality of word lines beside the primary location when the secondary location is one of the source line and the plurality of bit lines.

13. The controller as set forth in claim 8, wherein the controller is further configured to:
instruct the memory apparatus to apply an erase voltage to each of the strings while simultaneously grounding the plurality of word lines to encourage erasing of the memory cells corresponding with the plurality of word lines during the erase operation in response to receiving an erase command;
instruct the memory apparatus to apply an erase verify voltage to the plurality of word lines;
determine whether the memory cells connected to the plurality of word lines have the threshold voltage less than or equal to the erase verify voltage;
instruct the memory apparatus to increase the erase voltage and return to apply the erase voltage to each of the strings while simultaneously grounding the plurality of word lines to encourage erasing of the memory cells corresponding with the plurality of word lines during the erase operation in response to the memory cells connected to the plurality of word lines having the threshold voltage not less than or equal to the erase verify voltage;
instruct the memory apparatus to apply the primary predetermined voltage to the primary location of the memory apparatus following the erase operation of the memory cells while simultaneously applying the secondary predetermined voltage being lower than the primary predetermined voltage to the secondary location and measuring the leak current at the primary location in response to the memory cells connected to the plurality of word lines having the threshold voltage less than or equal to the erase verify voltage; and
determine the erase operation failed in response to the leak current measured being greater than the predetermined leak threshold.

14. A method of operating a memory apparatus including memory cells connected to one of a plurality of word lines and arranged in strings and configured to retain a threshold voltage, the method comprising the steps of:
applying a primary predetermined voltage to a primary location of the memory apparatus following an erase operation of the memory cells while simultaneously applying a secondary predetermined voltage being lower than the primary predetermined voltage to a secondary location of the memory apparatus and measuring a leak current at the primary location; and
determining the erase operation passed in response to the leak current measured not being greater than a predetermined leak threshold.

15. The method as set forth in claim 14, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed immediately adjacent the at least one drain-side select gate transistor and an edge word line being disposed vertically below the at least one dummy word line, and the primary location is the edge word line and the secondary location is the at least one dummy word line disposed immediately adjacent the edge word line in the stack.

16. The method as set forth in claim 15, wherein the plurality of word lines includes a plurality of other data word lines disposed vertically below the edge word line in the stack and the method further includes the steps of:
    recursively applying the primary predetermined voltage to each of a first one of the plurality of other data word lines while simultaneously applying the secondary predetermined voltage being lower than the primary predetermined voltage to each of a second one of the plurality of other data word lines disposed vertically above the first one of the plurality of other data word lines and measuring a leak current at each of the first one of the plurality of other data word lines, and
    determining the erase operation passed in response to the leak current measured at all of the first one of the plurality of other data word lines not being greater than the predetermined leak threshold.

17. The method as set forth in claim 14, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the primary location is one of the plurality of word lines and the secondary location is the one of the plurality of bit lines.

18. The method as set forth in claim 14, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the primary location is one of the plurality of word lines and the secondary location is the source line.

19. The method as set forth in claim 14, wherein the plurality of word lines and a plurality of dielectric layers extend horizontally and overlay one another in an alternating fashion in a stack and the strings extend vertically through the stack, the memory cells connected in series between at least one drain-side select gate transistor on a drain-side of each of the strings and connected to one of a plurality of bit lines and at least one source-side select gate transistor on a source-side of each of the strings and connected to a source line, the plurality of word lines include at least one dummy word line being disposed vertically above a plurality of other data word lines and immediately adjacent the at least one drain-side select gate transistor and an edge word line being disposed vertically below the at least one dummy word line, and the method further includes the steps of:
    applying a read voltage to the at least one drain-side select gate transistor and the at least one source-side select gate transistor and other ones of the plurality of word lines beside the primary location and the secondary location when the secondary location is one of the plurality of word lines; and
    applying the read voltage to the at least one drain-side select gate transistor and the at least one source-side select gate transistor and other ones of the plurality of word lines beside the primary location when the secondary location is one of the source line and the plurality of bit lines.

20. The method as set forth in claim 14, further including the steps of:
    applying an erase voltage to each of the strings while simultaneously grounding the plurality of word lines to encourage erasing of the memory cells corresponding with the plurality of word lines during the erase operation in response to receiving an erase command;
    applying an erase verify voltage to the plurality of word lines;
    determining whether the memory cells connected to the plurality of word lines have the threshold voltage less than or equal to the erase verify voltage;
    increasing the erase voltage and returning to applying the erase voltage to each of the strings while simultaneously grounding the plurality of word lines to encourage erasing of the memory cells corresponding with the plurality of word lines during the erase operation in response to the memory cells connected to the plurality of word lines having the threshold voltage not less than or equal to the erase verify voltage;
    applying the primary predetermined voltage to the primary location of the memory apparatus following the erase operation of the memory cells while simultaneously applying the secondary predetermined voltage being lower than the primary predetermined voltage to the secondary location and measuring the leak current at the primary location in response to the memory cells connected to the plurality of word lines having the threshold voltage less than or equal to the erase verify voltage; and
    determining the erase operation failed in response to the leak current measured being greater than the predetermined leak threshold.

* * * * *